United States Patent
Nakamura

(10) Patent No.: US 12,528,150 B2
(45) Date of Patent: Jan. 20, 2026

(54) POLISHING APPARATUS AND POLISHING METHOD

(71) Applicant: Ebara Corporation, Tokyo (JP)

(72) Inventor: Akira Nakamura, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 1446 days.

(21) Appl. No.: 16/507,381

(22) Filed: Jul. 10, 2019

(65) Prior Publication Data
US 2020/0016720 A1 Jan. 16, 2020

(30) Foreign Application Priority Data
Jul. 13, 2018 (JP) ................................. 2018-133606

(51) Int. Cl.
| | |
|---|---|
| B24B 37/005 | (2012.01) |
| B24B 37/20 | (2012.01) |
| G01B 7/06 | (2006.01) |
| H01L 21/66 | (2006.01) |
| H01L 21/768 | (2006.01) |

(52) U.S. Cl.
CPC ............ *B24B 37/005* (2013.01); *B24B 37/20* (2013.01); *G01B 7/105* (2013.01); *H01L 21/7684* (2013.01); *H01L 22/14* (2013.01); *H01L 22/26* (2013.01)

(58) Field of Classification Search
None
See application file for complete search history.

(56) References Cited

U.S. PATENT DOCUMENTS

| | | | |
|---|---|---|---|
| 7,508,201 B2 | 3/2009 | Tada et al. | |
| 9,068,814 B2* | 6/2015 | Takahashi | G01B 7/105 |
| 2007/0205112 A1* | 9/2007 | Kodera | H01L 21/32125 |
| | | | 257/E21.583 |
| 2009/0096446 A1* | 4/2009 | Takahashi | G01B 7/105 |
| | | | 324/230 |
| 2013/0273814 A1 | 10/2013 | Kobayashi et al. | |
| 2018/0001437 A1 | 1/2018 | Nakamura | |

(Continued)

FOREIGN PATENT DOCUMENTS

| | | | | |
|---|---|---|---|---|
| CN | 1972780 A | * | 5/2007 | ........... B24B 37/005 |
| JP | 2005-121616 A | | 5/2005 | |
| JP | 2009094382 A | * | 4/2009 | ............. G01B 7/105 |

(Continued)

*Primary Examiner* — Telly D Green
(74) *Attorney, Agent, or Firm* — Leydig, Voit & Mayer, Ltd.

(57) ABSTRACT

A film thickness measuring apparatus and an end point detector monitor a film thickness of a conductive film based on an output of an eddy current sensor disposed in a polishing table. The output of the eddy current sensor includes an impedance component, and when a resistance component and a reactance component of the impedance component are associated with the respective axes of a coordinate system having two orthogonal coordinate axes, at least some points on the coordinate system corresponding to the impedance component form at least a part of a circle. The film thickness measuring apparatus determines a distance between a point on the coordinate system and the center of the circle, determines the film thickness from the impedance component and corrects the determined film thickness using the determined distance.

5 Claims, 13 Drawing Sheets

(56) References Cited

U.S. PATENT DOCUMENTS

| | | | |
|---|---|---|---|
| 2019/0193242 A1* | 6/2019 | Takahashi | B24B 37/013 |
| 2020/0016722 A1* | 1/2020 | Nakamura | B24B 37/013 |

FOREIGN PATENT DOCUMENTS

| | | | | |
|---|---|---|---|---|
| JP | 2009099842 A | * | 5/2009 | B24B 37/042 |
| JP | 5080933 B2 | * | 11/2012 | B24B 37/042 |
| JP | 5094320 B2 | * | 12/2012 | G01B 7/105 |
| JP | 2015085487 A | * | 5/2015 | B24B 37/005 |
| JP | 6030041 B2 | * | 11/2016 | B24B 37/005 |
| KR | 20130018604 A | * | 2/2013 | |
| KR | 10-2013-0117334 | | 10/2013 | |
| KR | 20150051150 A | * | 5/2015 | |
| KR | 101711259 B1 | * | 2/2017 | |
| KR | 20170015406 A | * | 2/2017 | |
| KR | 101809282 B1 | * | 12/2017 | |
| KR | 101901508 B1 | * | 9/2018 | |

\* cited by examiner

POLISHING APPARATUS AND POLISHING METHOD

CROSS-REFERENCE TO RELATED APPLICATION

This patent application claims the benefit of Japanese Patent Application No. 2018-133606, filed on Jul. 13, 2018, which is incorporated by reference in its entirety herein.

TECHNICAL FIELD

The present invention relates to a polishing apparatus and a polishing method.

BACKGROUND ART

As semiconductor devices become more highly integrated and implemented with higher density in recent years, the wiring of circuits has been further miniaturized and the number of layers of multilayer wiring has also been increasing. In order to realize multilayer wiring while achieving circuit miniaturization, it is necessary to planarize the surfaces of the semiconductor devices with high accuracy.

Chemical mechanical polishing (CMP) is known as a technique of planarizing the surface of a semiconductor device. A polishing apparatus for performing CMP is provided with a polishing table to which a polishing pad is attached, and a top ring for holding a polishing target (e.g., a substrate such as a semiconductor wafer or each kind of film formed on the surface of a substrate). The polishing apparatus polishes the polishing target by pressing the polishing target held by the top ring against the polishing pad while rotating the polishing table.

The polishing apparatus is provided with a monitoring apparatus that monitors a film thickness of a conductive film to detect an end point of a polishing step based on the film thickness of the polishing target. The monitoring apparatus is provided with a film thickness sensor to detect a film thickness of the polishing target. A typical example of the film thickness sensor is an eddy current sensor.

The eddy current sensor is disposed in a hole or the like formed in a polishing table, and detects the film thickness when it is located opposite to the polishing target while rotating along with the rotation of the polishing table. The eddy current sensor causes the polishing target such as a conductive film to induce eddy current therein, and detects a change of thickness of the polishing target from a change of a magnetic field generated by the eddy current induced in the polishing target.

Japanese Patent Laid-Open No. 2005-121616 discloses a technique relating to an eddy current sensor. This eddy current sensor is provided with a sensor coil disposed in the vicinity of a conductive film, a signal source that supplies an AC signal to the sensor coil to form an eddy current in the conductive film and a detection circuit that detects the eddy current formed in the conductive film as an impedance seen from the sensor coil. The eddy current sensor then displays a resistance component and a reactance component of the impedance on orthogonal coordinate axes. A film thickness of the conductive film is detected from an angle formed between a straight line connecting the coordinates of the impedance and the coordinates of a specified central point and a horizontal line shown in FIG. 13 in the Publication.

Regarding the method of obtaining the film thickness from the angle, a relationship between the angle and the film thickness as shown in FIG. 13 in the Publication is measured in advance, and the angle is directly converted to the film thickness using this relationship. More specifically, a central point (reference point) P according to the film quality of the conductive film, and a large number of angles of elevation $\theta$ relating to many film thicknesses of the conductive film are obtained and stored in a memory. One preliminary measurement straight line is obtained for each angle of elevation $\theta$. A large number of preliminary measurement straight lines are obtained in accordance with a large number of angles of elevation $\theta$. After this, during operation of a substrate polishing apparatus, the film thickness of the conductive film is calculated based on the angle of elevation $\theta$ of a measurement straight line rn connecting the output values of the resistance component and the reactance component of the impedance for each measurement and the central point P in the memory, and the preliminary measurement straight lines.

It is conventionally known that film thickness can be measured at a central part of a substrate or the like with higher accuracy than at edges of the substrate or the like. This is because, for an eddy current sensor, in the vicinity of the edges of the substrate or the like, a part of a magnetic flux generated by the eddy current sensor exists outside the substrate, which prevents the whole magnetic flux generated by the eddy current sensor from being used effectively. Japanese Patent Laid-Open No. 2005-121616 does not take into consideration that the accuracy of measured values obtained at the edges of the substrate or the like is lowered.

CITATION LIST

Patent Literature

PTL 1: Japanese Patent Laid-Open No. 2005-121616

An aspect of the present invention has been implemented to solve the above-described problem, and it is an object of the present invention to provide a polishing apparatus and a polishing method capable of improving the accuracy of measured values obtained at edges or the like of a substrate.

SUMMARY

According to one embodiment 1, a polishing apparatus is provided with a rotatable polishing table that can hold a polishing pad having a polishing surface, a top ring that can press a substrate to be polished against the polishing surface and can polish a conductive film on the substrate, an eddy current sensor disposed in the polishing table, and a monitoring apparatus that can monitor a film thickness of the conductive film based on an output of the eddy current sensor, wherein the output of the eddy current sensor includes an impedance component, when a resistance component and a reactance component of the impedance component are associated with respective axes of a coordinate system having two orthogonal coordinate axes, at least some points on the coordinate system corresponding to the impedance component form at least a part of a circle, and the monitoring apparatus determines a first distance between the point on the coordinate system and the center of the circle, determines a film thickness from the impedance component and can correct the determined film thickness using the determined first distance.

According to one embodiment 2, in the polishing apparatus according to embodiment 1, the monitoring apparatus performs the correction using a predetermined correction coefficient in accordance with the first distance.

According to one embodiment 3, in the polishing apparatus according to embodiment 1 or 2, the monitoring apparatus performs the correction on the film thickness obtained in a peripheral part of the substrate.

According to one embodiment 4, in the polishing apparatus according to any one of embodiments 1 to 3, the monitoring apparatus determines a second distance corresponding to a radius of the circle and performs the correction using the first distance and the second distance.

According to one embodiment 5, the polishing apparatus according to any one of embodiments s 1 to 4, further includes a temperature sensor that can directly or indirectly measure a temperature of the substrate under polishing, and a temperature correction unit that can further correct the corrected film thickness using the measured temperature.

According to one embodiment 6, a polishing method of polishing a substrate to be polished, includes pressing a substrate to be polished against a polishing surface and polishing a conductive film on the substrate, forming an eddy current in the conductive film to measure a film thickness of the conductive film and detecting the formed eddy current, outputting the detected eddy current as an impedance component, and a monitoring step of receiving the impedance component as input and monitoring the film thickness of the conductive film from the inputted impedance component, wherein when a resistance component and a reactance component of the impedance component are associated with respective axes of a coordinate system having two orthogonal coordinate axes, at least some points on the coordinate system corresponding to the impedance component form at least a part of a circle, and the monitoring step includes determining a first distance between the point on the coordinate system and the center of the circle, determining a film thickness from the impedance component and correcting the determined film thickness using the determined first distance.

DESCRIPTION OF EMBODIMENTS

Figure 1:
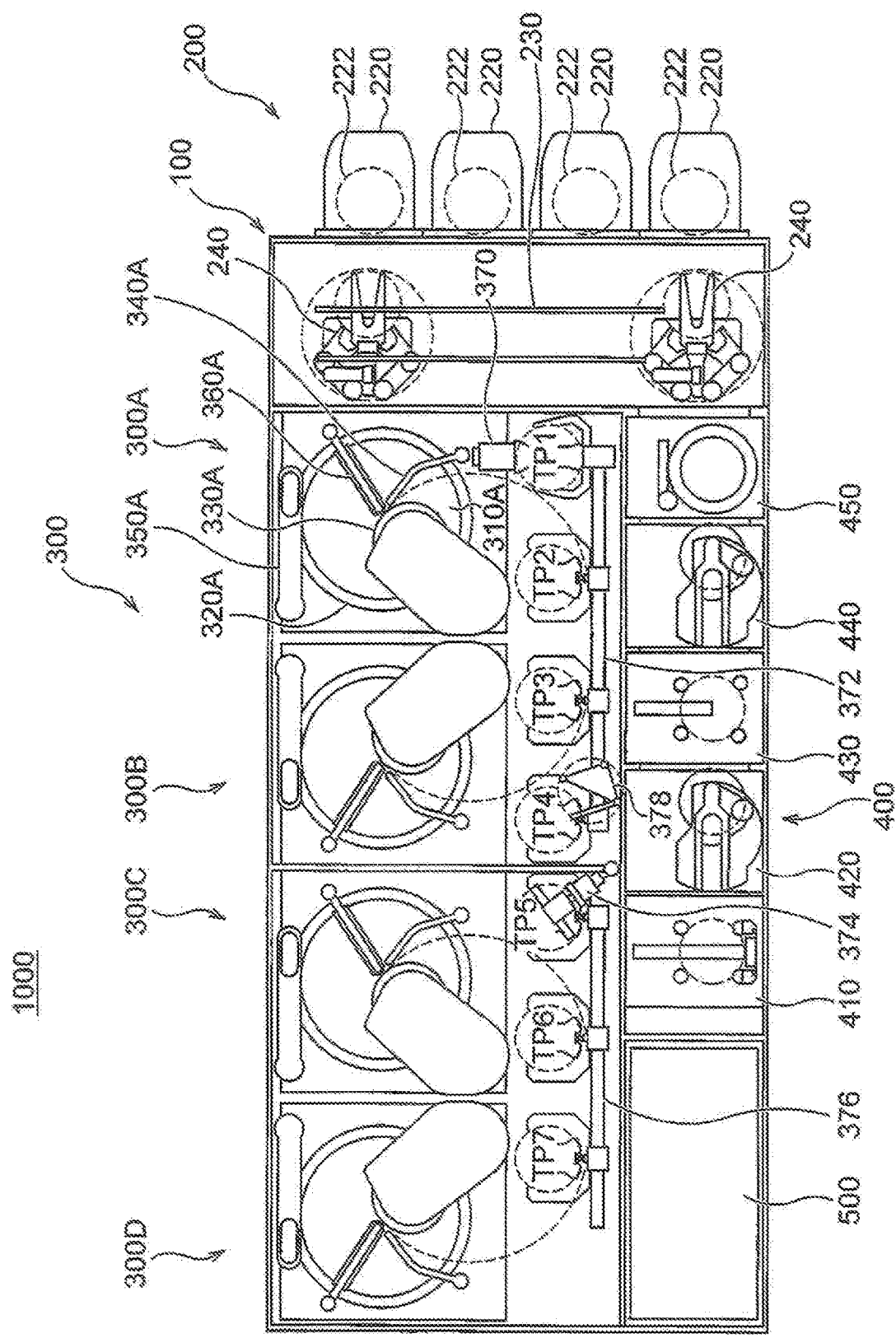
FIG. 1 is a plan view illustrating an overall configuration of a substrate processing apparatus according to an embodiment of the present invention.

Hereinafter, embodiments of the present invention will be described with reference to the accompanying drawings. Note that in the following embodiments, identical or corresponding members are assigned the same reference numerals and overlapping description thereof may be omitted. Furthermore, features described in each embodiment are applicable to other embodiments as long as the features do not contradict each other.

<Substrate Processing Apparatus>

FIG. 1 is a plan view of a substrate processing apparatus. As shown in FIG. 1, the substrate processing apparatus 1000 is provided with a loading/unloading unit 200, a polishing unit 300 and a cleaning unit 400. The substrate processing apparatus 1000 is further provided with a control unit 500 for controlling various operations of the loading/unloading unit 200, the polishing unit 300 and the cleaning unit 400. Hereinafter, the loading/unloading unit 200, the polishing unit 300 and the cleaning unit 400 will be described.

<Loading/Unloading Unit>

The loading/unloading unit 200 is a unit for passing a substrate before being subjected to processing such as polishing and cleaning to the polishing unit 300 and receiving the substrate after being subjected to processing such as polishing and cleaning from the cleaning unit 400. The loading/unloading unit 200 is provided with a plurality of (four units in the present embodiment) front loading units 220. The front loading units 220 are each mounted with a cassette 222 to stock substrates.

The loading/unloading unit 200 is provided with a rail 230 disposed inside a housing 100 and a plurality of (two in the present embodiment) transport robots 240 disposed on the rail 230. The transport robot 240 extracts a substrate before being subjected to processing such as polishing and cleaning from the cassette 222 and passes it to the polishing unit 300. Furthermore, the transport robot 240 receives a substrate after being subjected to processing such as polishing and cleaning from the cleaning unit 400 and returns it to the cassette 222.

<Polishing Unit>

The polishing unit 300 is a unit for polishing a substrate. The polishing unit 300 is provided with a first polishing unit 300A, a second polishing unit 300B, a third polishing unit 300C and a fourth polishing unit 300D. The first polishing unit 300A, the second polishing unit 300B, the third polishing unit 300C and the fourth polishing unit 300D have the same configuration. Therefore, only the first polishing unit 300A will be described hereinafter.

The first polishing unit 300A (polishing apparatus) is provided with a polishing table 320A and a top ring 330A. The polishing table 320A is driven to rotate by a drive source which is not shown. A polishing pad 310A is pasted to the polishing table 320A. The top ring 330A holds a substrate and presses the substrate against the polishing pad 310A. The top ring 330A is driven to rotate by a drive source which is not shown. The substrate is held to the top ring 330A, pressed against the polishing pad 310A and is thereby polished.

Next, a transport mechanism for transporting the substrate will be described. The transport mechanism is provided with a lifter 370, a first linear transporter 372, a swing transporter 374, a second linear transporter 376 and a temporary stand 378.

The lifter 370 receives a substrate from the transport robot 240. The first linear transporter 372 transports the substrate received from the lifter 370 between a first transfer position TP1, a second transfer position TP2, a third transfer position TP3 and a fourth transfer position TP4. The first polishing unit 300A and the second polishing unit 300B receive the substrate from the first linear transporter 372 and polish it. The first polishing unit 300A and the second polishing unit 300B pass the polished substrate to the first linear transporter 372.

The swing transporter 374 transports the substrate between the first linear transporter 372 and the second linear transporter 376. The second linear transporter 376 transports the substrate received from the swing transporter 374 among a fifth transfer position TP5, a sixth transfer position TP6 and a seventh transfer position TP7. The third polishing unit 300C and the fourth polishing unit 300D receive the substrate from the second linear transporter 376 and polish it. The third polishing unit 300C and the fourth polishing unit 300D pass the polished substrate to the second linear transporter 376. The substrate polished by the polishing unit 300 is placed on the temporary stand 378 by the swing transporter 374.

<Cleaning Unit>

The cleaning unit 400 is a unit for cleaning and drying the substrate polished by the polishing unit 300. The cleaning unit 400 is provided with a first cleaning chamber 410, a first transport chamber 420, a second cleaning chamber 430, a second transport chamber 440 and a drying chamber 450.

The substrate placed on the temporary stand 378 is transported to the first cleaning chamber 410 or the second cleaning chamber 430 via the first transport chamber 420. The substrate is cleaned in the first cleaning chamber 410 or the second cleaning chamber 430. The substrate cleaned in the first cleaning chamber 410 or the second cleaning chamber 430 is transported to the drying chamber 450 via the second transport chamber 440. The substrate is dried in the drying chamber 450. The dried substrate is extracted from the drying chamber 450 and returned to the cassette 222 by the transport robot 240.

<Detailed Configuration of First Polishing Unit>

Figure 2:
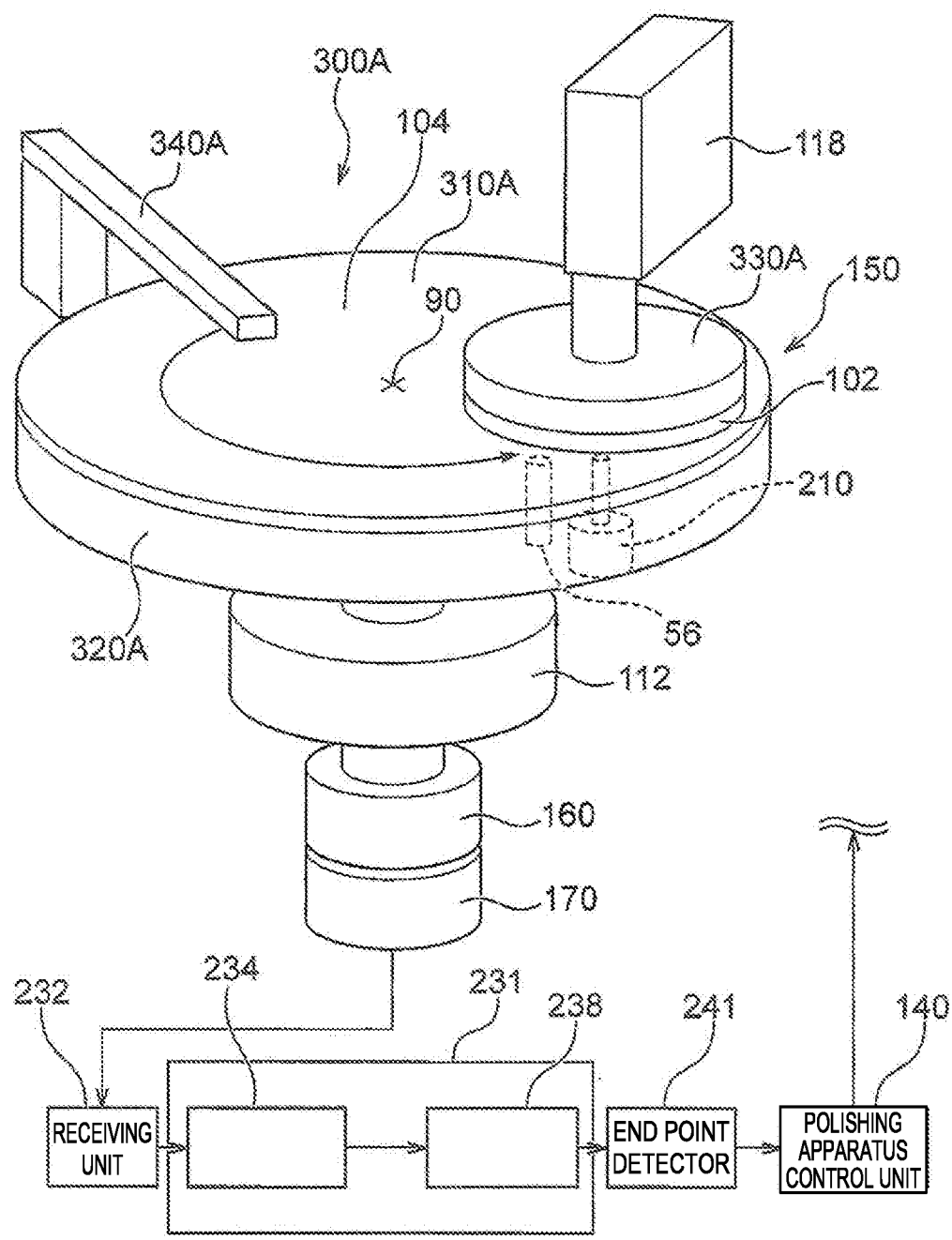
FIG. 2 is a diagram schematically illustrating an overall configuration of a polishing apparatus.
Figure 3A:
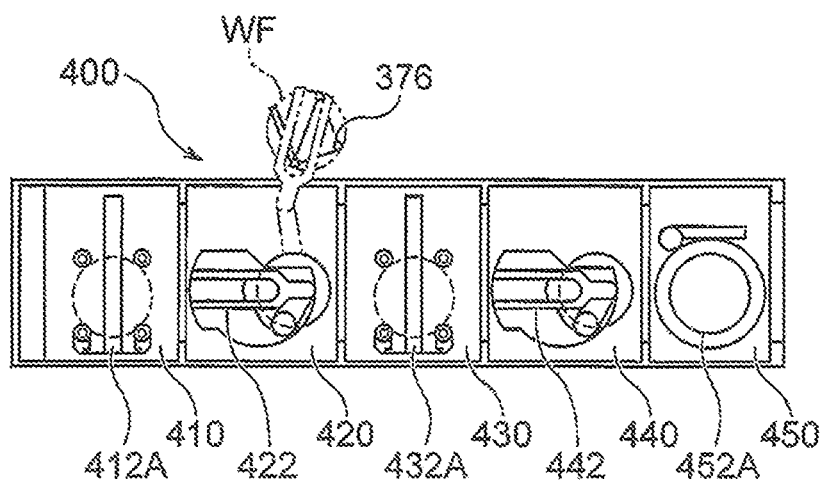
FIG. 3A is a plan view of a cleaning unit.
Figure 3B:
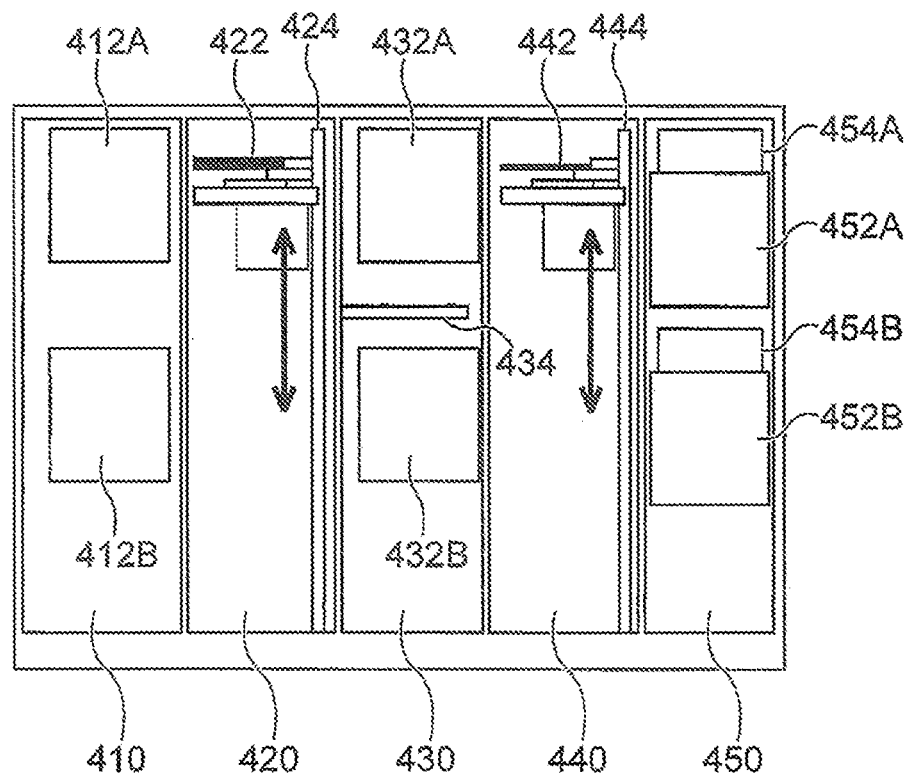
FIG. 3B is a side view of the cleaning unit.

Next, details of the first polishing unit 300A will be described. FIG. 2 is a perspective view of the first polishing unit 300A. The first polishing unit 300A is provided with a polishing liquid supply nozzle 340A for supplying a polishing liquid or a dressing liquid to the polishing pad 310A. The polishing liquid is, for example, slurry. The dressing liquid is, for example, pure water. The first polishing unit 300A is provided with a dresser 350A for performing conditioning of the polishing pad 310A. The first polishing unit 300A is also provided with an atomizer 360A for jetting a liquid or a mixed fluid of liquid and gas toward the polishing pad 310A. The liquid is, for example, pure water. The gas is, for example, a nitrogen gas.

The first polishing unit 300A includes a polishing unit 150 for polishing a polishing target (e.g., substrate such as a semiconductor wafer or various conductive films formed on the surface of the substrate) 102. The polishing unit 150 is provided with the polishing table 320A, on a top surface of which the polishing pad 310A for polishing the polishing target 102 can be mounted, a first electric motor 112 for driving the polishing table 320A to rotate, the top ring 330A that can hold the polishing target 102 and a second electric motor 118 that can drive the top ring 330A to rotate.

The polishing unit 150 is provided with the polishing liquid supply nozzle 340A that supplies a polishing abrasive liquid containing a polishing material to the top surface of the polishing pad 310A. The first polishing unit 300A is provided with a polishing apparatus control unit 140 that outputs various control signals associated with the polishing unit 150.

The first polishing unit 300A is provided with an eddy current sensor 210 disposed in a hole formed in the polishing table 320A to detect a film thickness of the polishing target 102 along a polishing surface 104 as the polishing table 320A rotates.

When polishing the polishing target 102, the first polishing unit 300A supplies polishing slurry containing polishing abrasive grain from the polishing liquid supply nozzle 340A to the top surface of the polishing pad 310A and causes the first electric motor 112 to drive the polishing table 320A to rotate. The first polishing unit 300A causes the top ring 330A to rotate around an axis of rotation decentered from the rotation shaft of the polishing table 320A and presses the polishing target 102 held to the top ring 330A against the polishing pad 310A. Thus, the polishing target 102 is polished and planarized by the polishing pad 310A holding the polishing slurry.

A receiving unit 232 is connected to the eddy current sensor 210 via rotary joint connectors 160 and 170. The receiving unit 232 receives a signal outputted from the eddy current sensor 210 and outputs the signal as impedance. A temperature sensor 56, which will be described later, is connected to the polishing apparatus control unit 140 via the rotary joint connectors 160 and 170.

As shown in FIG. 2, a film thickness measuring apparatus 231 performs predetermined signal processing on the impedance outputted from the receiving unit 232 and outputs the impedance to an end point detector 241.

The end point detector 241 monitors a change in the film thickness of the polishing target 102 based on the signal outputted from the film thickness measuring apparatus 231. The film thickness measuring apparatus 231 and the end point detector 241 constitute a monitoring apparatus. The end point detector 241 is connected to the polishing apparatus control unit 140 that performs various kinds of control relating to the first polishing unit 300A. Upon detecting a polishing end point of the polishing target 102, the end point detector 241 outputs a signal indicating the polishing end point to the polishing apparatus control unit 140. Upon receiving the signal indicating the polishing end point from the end point detector 241, the polishing apparatus control unit 140 causes the polishing by the first polishing unit 300A to end. During polishing, the polishing apparatus control unit 140 controls the pressing pressure to the polishing target 102 based on the film thickness.

In the present embodiment, the output of the eddy current sensor 210 includes an impedance component. When a resistance component and a reactance component of the impedance component are associated with respective axes of a coordinate system having two orthogonal coordinate axes, at least some points on the coordinate system corresponding to the impedance component form at least a part of the circle. The monitoring apparatus determines a first distance between the point on the coordinate system and the center of the circle, determines the film thickness from the impedance component and corrects the determined film thickness using the determined first distance.

Here, the "impedance component" means the resistance component and/or the reactance component of an impedance.

In the present embodiment, the monitoring apparatus determines the first distance between the point on the coordinate system and the center of the circle, determines the film thickness from the impedance component, and can correct the determined film thickness using the determined first distance. Measured values obtained at places such as the central part of the substrate where a film thickness can be measured with higher accuracy than at edges of the substrate or the like are located on the circle (impedance curve). However, the present embodiment focuses on the fact that measured values obtained at places such as the edges of the substrate where a film thickness conventionally cannot be measured accurately compared to the central part of the substrate or the like are not located on the circle.

A first distance from the center of the circle to the measured value is used as an index for indicating how much the accuracy is lowered in the measured value obtained at a place such as edges of the substrate where a film thickness cannot be measured accurately. As a result, the accuracy of measured values obtained at edges of the substrate or the like can be improved more than in the prior art. As a correction method, for example, the determined film thickness is multiplied by a ratio of a second distance, which will be described later, between the measured value obtained in the central part of the substrate and the center of the circle (impedance curve) divided by the first distance.

When the monitoring apparatus determines the film thickness from the impedance component, it is necessary to obtain a correspondence relationship between data obtained from the output of the eddy current sensor 210 and the film thickness in advance. In the present embodiment, the angle $\alpha$ is obtained from the output of the eddy current sensor 210. The definition of the angle $\alpha$ and details of the method of obtaining it will be described later.

As will be described later, $1/\tan \alpha$ calculated from the angle $\alpha$ is proportional to the film thickness t when the film thickness is large. That is, when $1/\tan \alpha = Ta$ is assumed, there is a relationship: film thickness $t = A\_th \times Ta$. Here, $A\_th$ is a proportion coefficient. In actual measurement of a film thickness, Ta can be obtained from a measured value of the eddy current sensor 210.

Therefore, when the film thickness is large, the proportion coefficient $A\_th$ in the correspondence relationship between the output of the eddy current sensor 210 and the film thickness: film thickness $t = A\_th \times Ta$ may be obtained in advance at the time of calibration of the eddy current sensor 210. Once the proportion coefficient $A\_th$ is obtained, the film thickness can be calculated if the angle $\alpha$ is obtained from the output of the eddy current sensor 210 in the measurement after the calibration. When the film thickness is small, the correspondence relationship between the output of the eddy current sensor 210 and the film thickness is a non-linear relationship. Note that the output of the eddy current sensor 210 may include an impedance (X, Y) which will be described later or the above-described angle $\alpha$, $\tan \alpha$, $1/\tan \alpha$, Ta or the like.

The monitoring apparatus performs correction using a predetermined correction coefficient, which will be described later, in accordance with the first distance. The predetermined correction coefficient by which the determined film thickness is to be multiplied or the like is measured in advance for a plurality of different first distances using the substrate, for example. The correction coefficient may be saved in a storage unit in the format of a function or a table or the like. The monitoring apparatus performs correction on the film thickness obtained in a peripheral part of the substrate W. The correction can be performed on the whole substrate, but the correction is preferably performed on the film thickness obtained in the peripheral part (edges) of the substrate. The monitoring apparatus determines a second distance, that is, the radius of the circle or a distance between a point on the coordinate system relating to the impedance component obtained in the part of the substrate W other than the peripheral part of the substrate W and the center of the circle. The monitoring apparatus calculates the correction coefficient using the first distance and the second distance and performs correction on the film thickness obtained in the peripheral part of the substrate W. Such processing is performed by a film thickness calculation unit 238, which will be described later.

Here, the second distance corresponding to the radius of the circle means the radius of a circle or a distance substantially equivalent to the radius of a circle. The "distance substantially equivalent to the radius of a circle" is, for example, a distance between a point on the coordinate system relating to the impedance component obtained in a part of the substrate other than the peripheral part of the substrate and the center of the circle. This is because the point on the coordinate system relating to the impedance component obtained in the part of the substrate other than the peripheral part of the substrate is substantially located on the circle.

In an embodiment, a degree of decrease in the accuracy is calculated from, for example, a ratio between a first distance and a second distance between a measured value obtained at a place such as a central part of the substrate where a film thickness can be conventionally measured with relatively high accuracy and the center of a circle, and a correction coefficient is calculated. The film thickness is corrected using the correction coefficient, and for example, the film thickness is multiplied by the correction coefficient, the correction coefficient is added to the film thickness, the film thickness is divided by the correction coefficient, and/or the correction coefficient is subtracted from the film thickness.

In the embodiment, the monitoring apparatus determines the second distance between the point on the coordinate system relating to the impedance component obtained in the part of the substrate other than the peripheral part of the substrate and the center of the circle and can perform the correction on the film thickness obtained in the peripheral part of the substrate using the first distance and the second distance.

Figure 4:
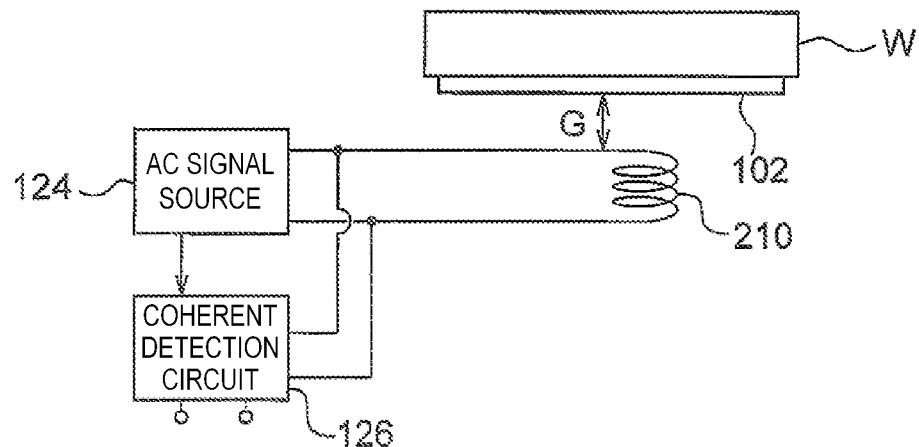
FIG. 4 is a block diagram illustrating a configuration example of an eddy current sensor that can measure impedance.

FIG. 4 illustrates the eddy current sensor 210 provided for the first polishing unit 300A. An impedance seen from the sensor coil toward the conductive film side changes and the eddy current sensor detects the film thickness from this impedance change. The eddy current sensor 210 disposes the sensor coil in the vicinity of the polishing target 102 to be detected and an AC signal source 124 is connected to the coil. The polishing target 102 to be detected is, for example, a copper plating film having a thickness on the order of 0 to 2 μm formed on a semiconductor wafer W (may also be a vapor deposition film of metallic material such as Au, Cr, W). The sensor coil is disposed in the vicinity, for example, on the order of 0.5 to 5 mm, of the conductive film to be detected. A coherent detection circuit 126 detects an impedance Z (components of which are X and Y) seen from the sensor coil side including the polishing target 102 to be detected (details will be described later).

Figure 5:
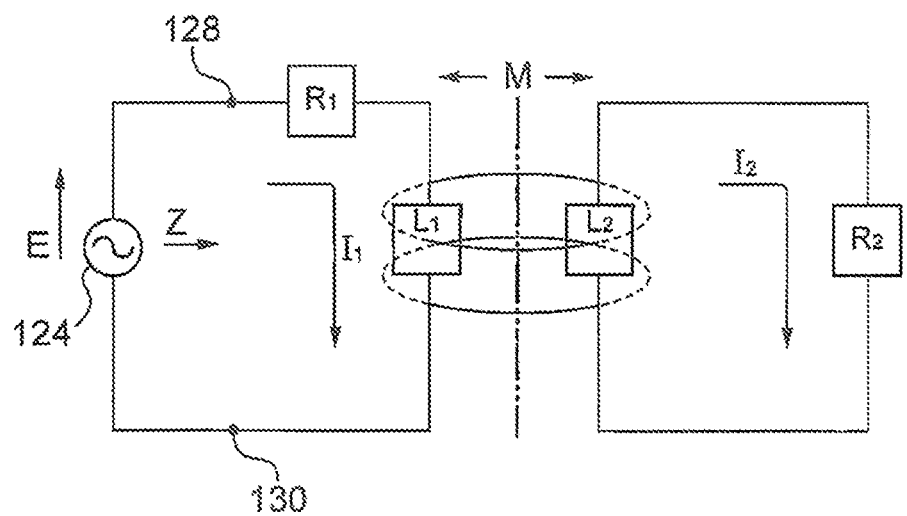
FIG. 5 is an equivalent circuit diagram of the block diagram in FIG. 4.

In an equivalent circuit shown in FIG. 5, an oscillating frequency of the AC signal source 124 is constant, and if the film thickness of the polishing target 102 changes, the impedance Z seen from the AC signal source 124 toward the sensor coil side changes. That is, in the equivalent circuit shown in FIG. 5, an eddy current $I_2$ flowing into the polishing target 102 is determined by an equivalent resistance $R_2$ and a self-inductance $L_2$ of the polishing target 102. When the film thickness changes, the eddy current $I_2$ changes, which is considered as a change in the impedance Z seen from the AC signal source 124 side via a mutual inductance M with the sensor coil side. Here, $L_1$ is a self-inductance portion of the sensor coil and $R_1$ is a resistance portion of the sensor coil.

Hereinafter, the eddy current sensor will be described more specifically. The AC signal source 124 is an oscillator having a fixed frequency on the order of 1 to 50 MHz, and, for example, a crystal oscillator is used. An AC voltage supplied by the AC signal source 124 causes the current $I_1$ to flow through the sensor coil. A current flows through the coil disposed in the vicinity of the polishing target 102 and this magnetic flux interlinks with the polishing target 102, a mutual inductance M is thereby formed and the eddy current $I_2$ flows through the polishing target 102. Here, $R_1$ is an equivalent resistance on the primary side including the sensor coil and $L_1$ is a self-inductance on the primary side including the sensor coil likewise. On the polishing target 102 side, $R_2$ is an equivalent resistance corresponding to an eddy current loss and $L_2$ is a self-inductance thereof. The impedance Z seen from terminals 128 and 130 of the AC signal source 124 toward the sensor coil side changes according to the magnitude of the eddy current loss formed in the polishing target 102.

Figure 6:
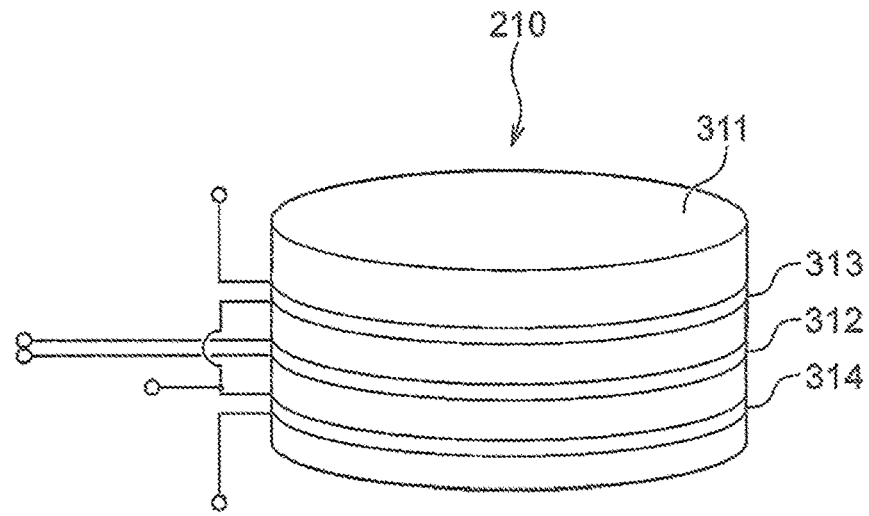
FIG. 6 is a perspective view illustrating a configuration example of a sensor coil of the eddy current sensor.

FIG. 6 illustrates a configuration example of the sensor coil in the eddy current sensor of the present embodiment. The sensor coil is formed by separating a coil for forming an eddy current in the conductive film from a coil for detecting the eddy current in the conductive film, and is constructed of three-layer coils wound around a bobbin 311. Here, an excitation coil 312 at the center is an excitation coil connected to the AC signal source 124. This excitation coil 312 forms an eddy current in the polishing target 102 on the semiconductor wafer W disposed in the vicinity through a magnetic field formed by the voltage supplied from the AC signal source 124. A detection coil 313 is disposed on the top side (conductive film side) of the bobbin 311 to detect a magnetic field generated by the eddy current formed in the conductive film. A balance coil 314 is disposed on the side opposite to the detection coil 313 of the excitation coil 312.

Figure 7:
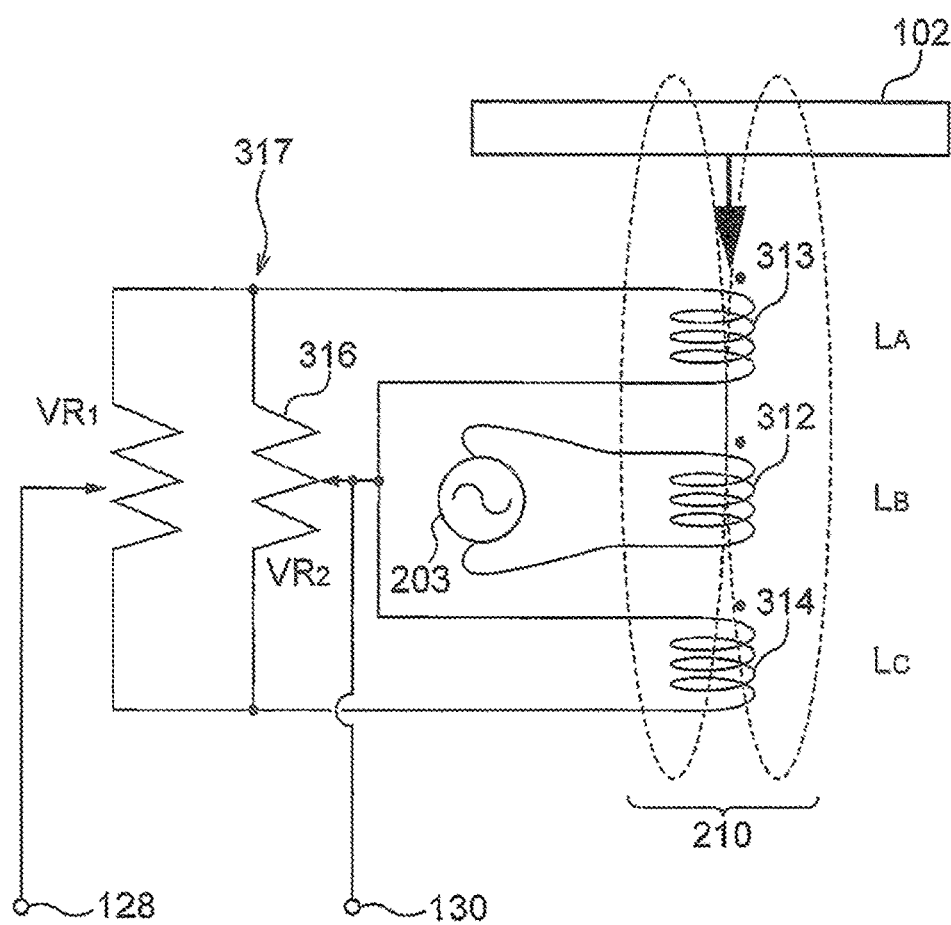
FIG. 7 is a circuit diagram illustrating a connection example of the sensor coil in FIG. 6.

FIG. 7 illustrates a connection example of each coil. The detection coil 313 and the balance coil 314 constitute a series circuit of opposite phases as described above, both ends of which are connected to a resistance bridge circuit 317 including a variable resistor 316. The coil 312 is connected to an AC signal source 203, generates an alternating magnetic flux and thereby forms an eddy current in the polishing target 102 which is the conductive film disposed in the vicinity thereof. By adjusting resistance values of variable resistors $VR_1$ and $VR_2$, the output voltage of the series circuit composed of the coils 313 and 314 can be adjusted to zero when no conductive film exists.

Figure 8:
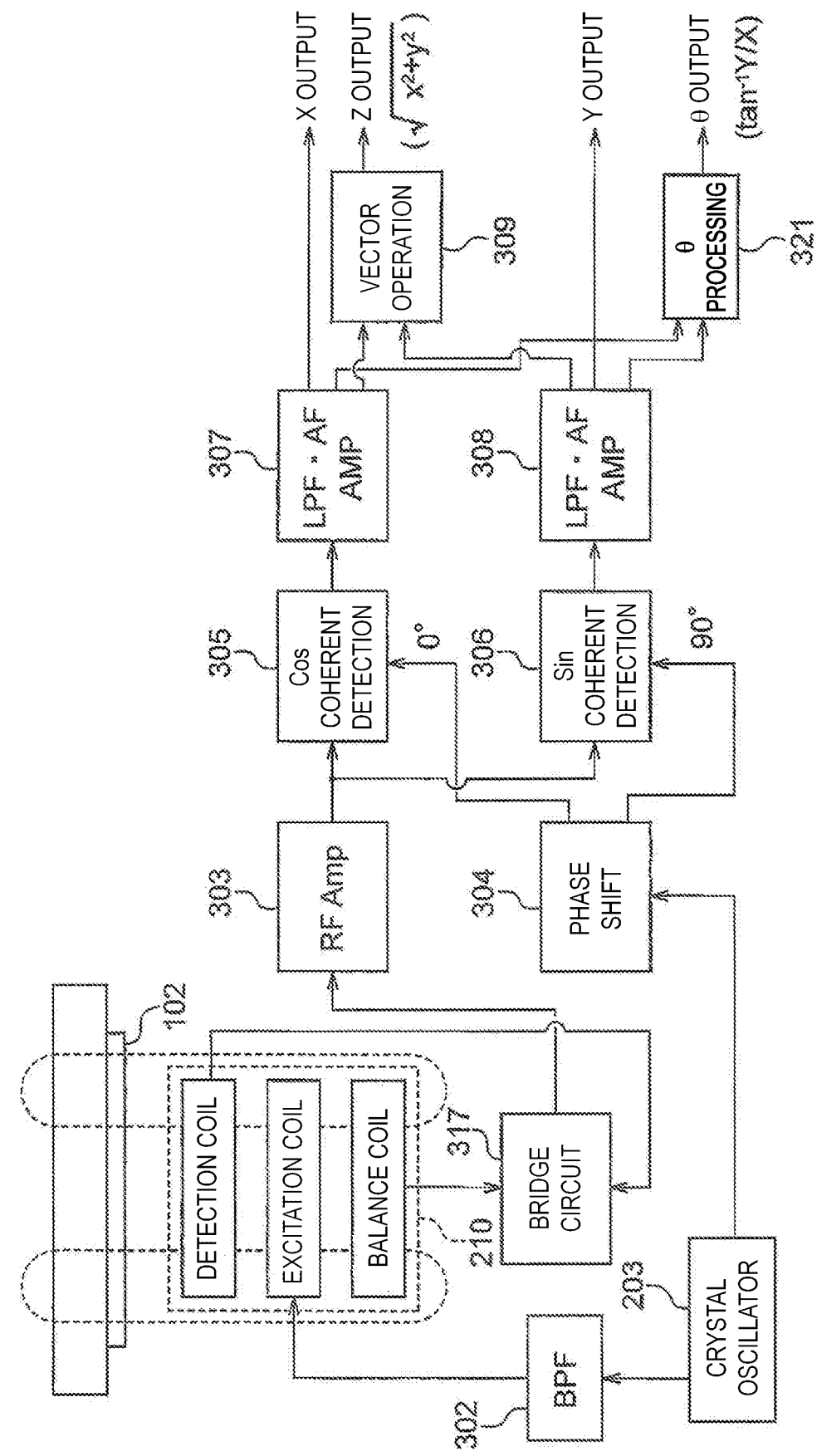
FIG. 8 is a block diagram illustrating a coherent detection circuit of a sensor coil output.

FIG. 8 shows an example of a measuring circuit of the impedance Z seen from the AC signal source 203 side toward a sensor coil 202 side. The measuring circuit of the impedance Z shown in FIG. 8 can extract impedance plane coordinate values (X, Y), (that is, reactance component (Y), resistance component (X)), impedance (Z=X+iY) and phase output ($\theta = \tan^{-1} Y/X$) accompanying a change in the film thickness. Therefore, using these signal outputs allows more multifaceted detection of a progress situation of processing such as measuring the film thickness from, for example, the magnitudes of various components of impedance.

As described above, the signal source 203 that supplies an AC signal to the sensor coil disposed in the vicinity of the semiconductor wafer W on which the polishing target 102 to be detected is formed as a film is an oscillator with a fixed frequency made up of a crystal oscillator. The AC signal source 203 supplies a voltage with a fixed frequency of, for example, 1 to 50 MHz. The AC voltage formed in the signal source 203 is supplied to the excitation coil 312 via a bandpass filter 302. Signals detected at the terminals 128 and 130 of the sensor coil are inputted to the coherent detection unit made up of a cos coherent detection circuit 305 and a sin coherent detection circuit 306 via a high frequency amplifier 303 and a phase shift circuit 304. The coherent detection unit extracts a cos component (x component) and a sin component (Y component) of the detection signal. Here, the phase shift circuit 304 forms two signals of an in-phase component (0°) and a quadrature component (90°) of the signal source 203 from the oscillating signal formed in the signal source 203. These signals are respectively introduced to the cos coherent detection circuit 305 and the sin coherent detection circuit 306, where the above-described coherent detection is performed.

Low-pass filters 307 and 308 remove unnecessary high frequency components of that of higher than the signal component, for example, 5 KHz or higher, from the signals subjected to coherent detection. The coherent-detected signals are an X component output which is a cos coherent detection output and a Y component output which is a sin coherent detection output. Also, a vector operation circuit 309 obtains the magnitude of the impedance Z, $(X^2+Y^2)^{1/2}$ from the X component output and the Y component output. The vector operation circuit (θ processing circuit) 321 can obtain phase output ($\theta = \tan^{-1} Y/X$) from the X component output and the Y component output as well. Here, these filters are provided to remove a noise component of the sensor signal and cutoff frequencies corresponding to the various filters are set.

Figure 9:
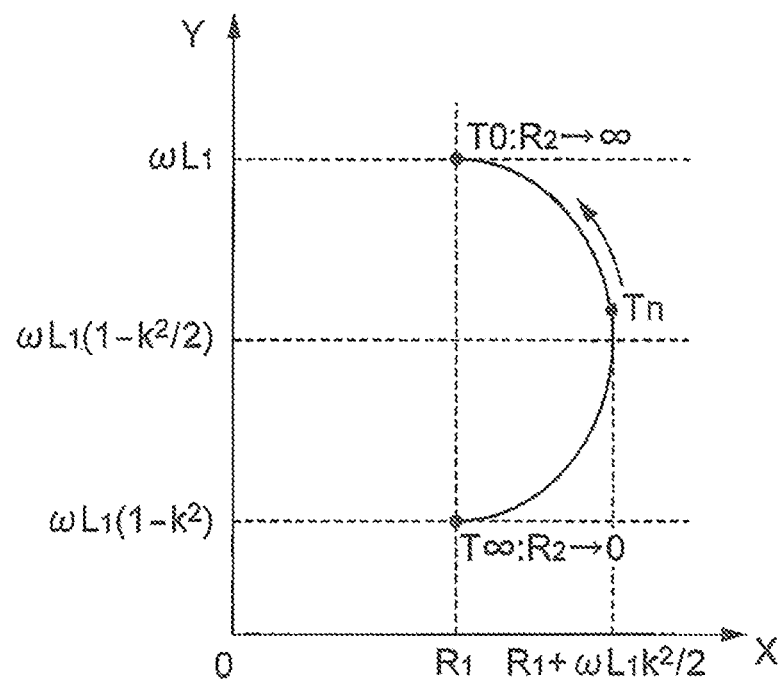
FIG. 9 is a graph illustrating a circular track of a resistance component (X) and a reactance component (Y) on an impedance coordinate plane accompanying a thickness change of a conductive film.

With reference to FIG. 9, the following will give the description that the points (coordinate values (X, Y)) on the impedance plane coordinate system that corresponds to the impedance obtained when the distance between the polishing target 102 and the eddy current sensor 210 differs will form different circles. The respective centers of the different circles are on the same straight line (second straight line). There is a common one point for the different circles. This is called a first point. These will be described.

The sensor-side circuit and the conductive-film-side circuit shown in FIG. 5 respectively hold the following equations.

$$R_1 I_1 + L_1 dI_1/dt + M dI_2/dt = E \quad (1)$$

$$R_2 I_2 + L_2 dI_2/dt + M dI_1/dt = 0 \quad (2)$$

where, M is mutual inductance, $R_1$ is an equivalent resistance of the sensor-side circuit and $L_1$ is a self-inductance of the sensor-side circuit. $R_2$ is an equivalent resistance of the conductive film from which an eddy current is induced and $L_2$ is a self-inductance of the conductive film into which the eddy current flows.

Here, when $I_n = A_n e^{j\omega t}$ (sine wave) is assumed, the above-described equations (1) and (2) are expressed as follows.

$$(R_1 + j\omega L_1)I_1 + j\omega M I_2 = E \quad (3)$$

$$(R_2 + j\omega L_2)I_2 + j\omega M I_1 = 0 \quad (4)$$

The following equation (5) is derived from these equations (3) and (4).

$$I_1 = E(R_2 + j\omega L_2)/\{(R_1 + j\omega L_1)(R_2 + j\omega L_2) + \omega^2 M^2\} = E/\{(R_1 + j\omega L_1) + \omega^2 M^2/(R_2 + j\omega L_2)\} \quad (5)$$

Therefore, the impedance Z of the sensor-side circuit is expressed by the following equation (6).

$$Z = E/I_1 = \{R_1 + \omega^2 M^2 R_2/(R_2^2 + \omega^2 L_2^2)\} + j\omega\{L_1 - \omega^2 L_2 M^2/(R_2^2 + \omega^2 L_2^2)\} \quad (6)$$

Here, if the real part (resistance component of the impedance component) and the imaginary part (inductive reactance component of the impedance component) of Z are assumed to be X and Y respectively, the above-described equation (6) becomes as follows.

$$Z = X + j\omega Y \quad (7)$$

Here, if $Rx = \omega^2 L_2 M^2/(R_2^2 + \omega^2 L_2^2)$ is assumed, equation (7) is $$X + j\omega Y = [R_1 + R_2 Rx] + J\omega[L_1 - L_2 Rx]$$

Therefore, $X = R_1 + R_2 Rx$ $Y = \omega[L_1 - L_2 Rx]$
If these are solved with respect to $R_2$ and $L_2$, $$R_2 = \omega^2(X - R_1)M^2/((\omega L_1 - Y)^2 + (X - R_1)^2) \quad (8)$$

$$L_2 = \omega(\omega L_1 - Y)M^2/((\omega L_1 - Y)^2 + (X - R_1)^2) \quad (9)$$

Symbol "k" shown in FIG. 9 is a coupling coefficient and the following relational expression (10) holds.

$$M = k(L_1 L_2)^{1/2} \quad (10)$$

When this is applied to equation (9), $$(X - R_1)^2 + (Y - \omega(1 - (k^2/2))L_1)^2 = (\omega L_1 k^2/2)^2 \quad (11)$$

This is an equation of a circle and shows that X and Y form a circle, that is, the impedance Z forms a circle.

The eddy current sensor 210 outputs the resistance component X and the inductive reactance component Y of the impedance of the electric circuit including the coil of the eddy current sensor 210. These resistance component X and inductive reactance component Y are film thickness signals reflecting the film thickness and change in accordance with the thickness of the conductive film on the substrate.

FIG. 9 is a graph drawn by plotting X and Y that change along with the thickness of the conductive film on the XY coordinate system. The coordinates of a point T∞ are X and Y when the film thickness is infinite, that is, when $R_2$ is 0. The coordinates of the point T0 are X and Y when the film thickness is 0, that is, when $R_2$ is infinite, if conductivity of the substrate is negligible. The point Tn positioned from the values of X and Y advances toward the point T0 while describing an arc-like track as the thickness of the conductive film decreases.

Figure 10:
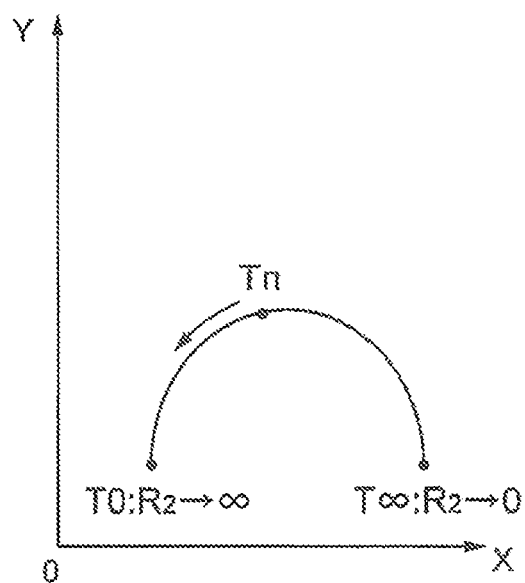
FIG. 10 is a graph resulting from rotating the graphic diagram in FIG. 9 counterclockwise by 90 degrees and further translating the graphic diagram.

FIG. 10 is a graph resulting from rotating the graphic diagram in FIG. 9 counterclockwise by 90 degrees and further translating the graphic diagram. As shown in FIG. 10, as the film thickness decreases, the point Tn positioned from the values of X and Y advances toward the point T0 while describing an arc-like track. The coupling coefficient k is a ratio at which the magnetic field generated by one coil transmits to the other coil. k=1 is maximum and when the distance between the coils is separated, that is, if the polishing pad 310A becomes thicker, k becomes smaller.

Figure 11:
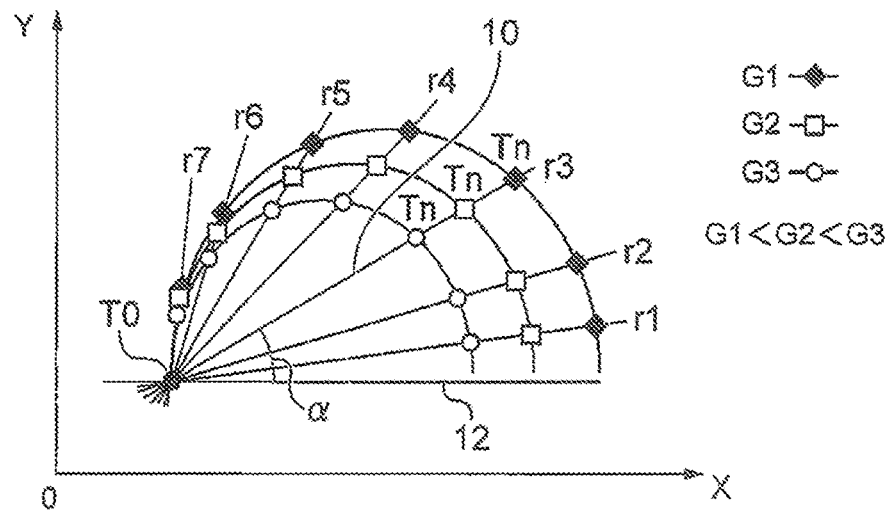
FIG. 11 is a graph illustrating how an arc-like track of coordinates X and Y changes in accordance with the distance corresponding to the thickness of a polishing pad used.

A distance G between the coil of the eddy current sensor 210 and the substrate W changes in accordance with the thickness of the polishing pad 310A interposed between them. As a result, as shown in FIG. 11, the arc-like track of the coordinates X and Y changes in accordance with the distance G (G1 to G3) corresponding to the thickness of the polishing pad 310A used. As is seen from FIG. 11, regardless of the distance G between the coil and the polishing target 102, the coordinates X and Y having the same film thickness are connected with a straight line (hereinafter referred to as equal film thickness straight line), the equal film thickness straight line intersects at a point of intersection P. The point P is the first point T0. This equal film thickness straight line rn (n: 1, 2, 3 . . . ) is inclined with respect to H (diameter of a circle passing through the first point in FIG. 11) by an angle α (impedance angle) according to the thickness of the conductive film (the polishing target 102). The diameter of the circle passing through the first point is the same regardless of the distance G.

The angle α is an angle formed between a first straight line connecting a first point (T0) corresponding to an impedance when the film thickness is zero and a second point (Tn) corresponding to an impedance when the film thickness is not zero and the diameter of a circle passing through the first point (T0). When the thickness of the conductive film is the same, the angle α is the same regardless of the difference in thickness of the polishing pad 310A. This will be described using FIG. 12. The predetermined straight line is also a straight line connecting the first point (T0) and the point T∞.

Figure 12:
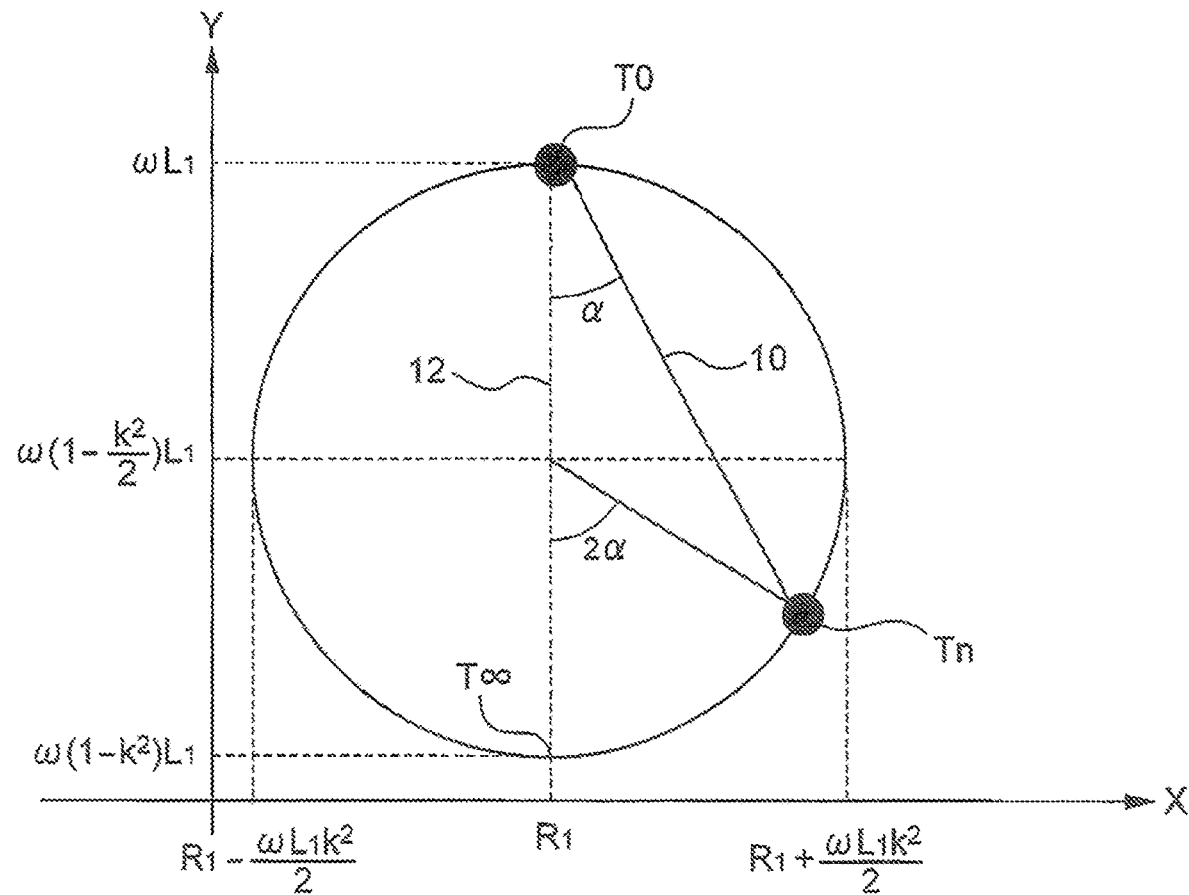
FIG. 12 is a diagram illustrating that an angle α remains the same despite the difference in thickness of the polishing pad.

The coordinates (X, Y) of the point Tn are expressed using the angle α shown in FIG. 12. From FIG. 12, $$X = R_1 + \omega(k^2/2)L_1 \sin\alpha \quad (12)$$

$$Y = \omega(1 - (k^2/2))L_1 - \omega(k^2/2)L_1 \cos\alpha \quad (13)$$

From (8) and (9) above, $$R_2/L_2 = \omega(X - R_1)/(\omega L_1 - Y)$$

When (12) and (13) are substituted into this equation, $$R_2/L_2 = \omega \sin 2\alpha/(1 + \cos 2\alpha) = \omega \tan\alpha \quad (14)$$

Since $R_2/L_2$ depends on only the film thickness, and does not depend on the coupling coefficient k, $R_2/L_2$ does not depend on the distance between the eddy current sensor 210 and the polishing target 102, that is, the thickness of the polishing pad 310A. $R_2/L_2$ depends on only the film thickness, and so the angle α also depends on only the film thickness. The film thickness calculation unit 238 calculates the tangent of the angle α and calculates the film thickness from the tangent using the relationship in (14).

The method of calculating the angle α and the method of calculating the film thickness will be described more specifically. In order to measure the film thickness of the polishing target, the film thickness measuring apparatus 231 in FIG. 2 receives an impedance as input from the receiving unit 232 when the eddy current sensor 210 detects an eddy current which can be formed in the polishing target 102 as an impedance. The film thickness is calculated from the inputted impedance. The film thickness measuring apparatus 231 is provided with an angle calculation unit 234 and a film thickness calculation unit 238.

First, the angle calculation unit 234 determines the center of the circle from three measuring points of the impedance component (three points corresponding to different film thicknesses) on the circle including the measured first point T0. The angle calculation unit 234 calculates a diameter 12 passing through the center of the circle from the first point T0 and the center of the circle. The angle calculation unit 234 calculates the angle α formed by the first straight line 10 connecting the first point T0 corresponding to the impedance when the film thickness is zero and the second point Tn corresponding to the impedance when the film thickness is not zero, and the diameter 12 of the circle passing through the first point T0. The film thickness calculation unit 238 calculates the tangent of the angle α and obtains the film thickness from the tangent.

Next, the film thickness calculation unit 238 that calculates the film thickness from the tangent will be described. The present embodiment uses a relationship between the reciprocal of the tangent and the film thickness. First, the relationship between the reciprocal of the tangent and the film thickness will be described.

When the film thickness is large, the aforementioned relationship (14) exists between the tangent and the resistance value of the metal film, that is, $$R_2/L_2 = \omega \tan \alpha \quad (14)$$

where $R_2$ is a resistance value of the metal film. Therefore, $R_2$ is proportional to tang. Furthermore, when the film thickness is large, $R_2$ has the following relationship with the film thickness.

$$R_2 = \rho L/tW \quad (15)$$

where ρ: resistivity, L, W: length and width of metal film, t: film thickness

From (14) and (15), it is seen that the film thickness t and the angle α have the following relationship.

$$R_2 \propto (1/t) \propto \omega \tan \alpha$$

That is, $1/\tan \alpha \propto t$

From this, $1/\tan \alpha$ is proportional to the film thickness t. If the above-described proportion coefficient is obtained in advance, the film thickness t can be calculated from $1/\tan \alpha$. When the film thickness is small, (15) does not hold, and so the relationship between $1/\tan \alpha$ and the film thickness t is expressed by a non-linear relationship.

Next, correction on the film thickness t determined as described above will be described, which is performed by the film thickness calculation unit 238 using a predetermined correction coefficient, which will be described later, in accordance with the first distance. First, the reason that the correction is necessary will be described using FIGS. 13 and 14. It is known that a film thickness can be measured at the central part of the substrate or the like with higher accuracy than at edges of the substrate or the like. Circles shown in FIGS. 9 to 12 are obtained through measurements at places on the substrate W such as the central part of the substrate W where a film thickness can be measured accurately. At places on the substrate W where a film thickness can be measured accurately, a point corresponding to the impedance is located on the circle regardless of the film thickness.

Figure 13:
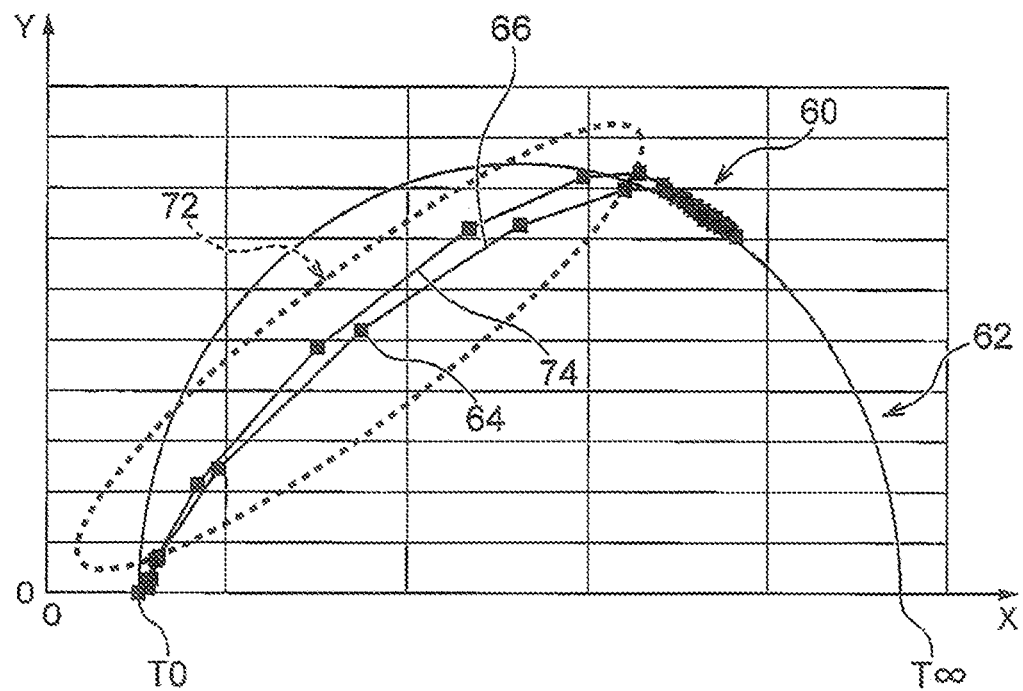
FIG. 13 is a graph illustrating a relationship between measured values at a central part and at edges of a substrate W, and a circular track.

On the other hand, a film thickness cannot be measured accurately at the edges of the substrate or the like. FIG. 13 illustrates such a case. This diagram is a graph illustrating a relationship between measured values at the central part and edges of the substrate W, and a circular track. In this diagram, measuring points 60 are obtained through measurements at the central part of the substrate W or the like, and are located on a circle 62. On the other hand, a measuring point 64 within a range enclosed by an ellipse 72 are obtained through measurements at edges of the substrate or the like, and are not located on the circle 62. A track 66 and a track 74 are tracks created from measured values obtained through measurements at edges of the substrate or the like for different substrates W.

Figure 14:
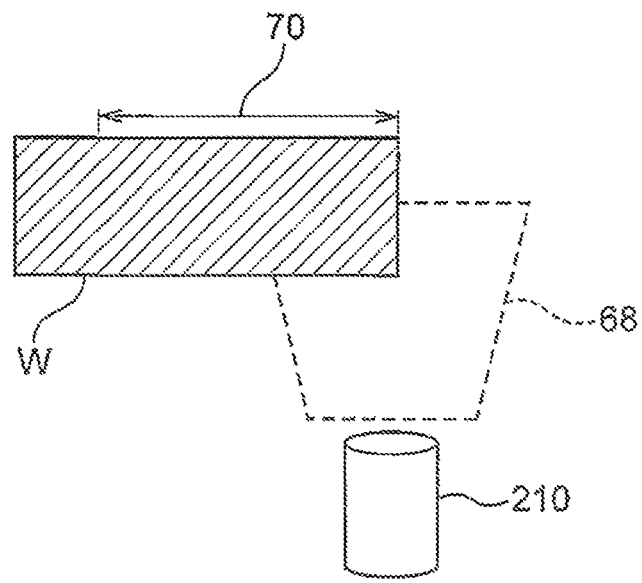
FIG. 14 illustrates a magnetic flux generated by an eddy current sensor at edges of a substrate.

The reason that the measuring points 64 at edges of the substrate W or the like are not located on the circle 62 will be described using FIG. 14. FIG. 14 illustrates a magnetic flux 68 generated by the eddy current sensor 210 at an edge 70 of the substrate W. As shown in this diagram, for the eddy current sensor 210, in the vicinity of the edge 70 of the substrate W or the like, a part of the magnetic flux 68 generated by the eddy current sensor 210 is located outside the substrate W. Thus, the whole magnetic flux 68 generated by the eddy current sensor 210 is not effectively, that is, fully used. As a result, the output of the eddy current sensor 210 decreases.

Figure 15:
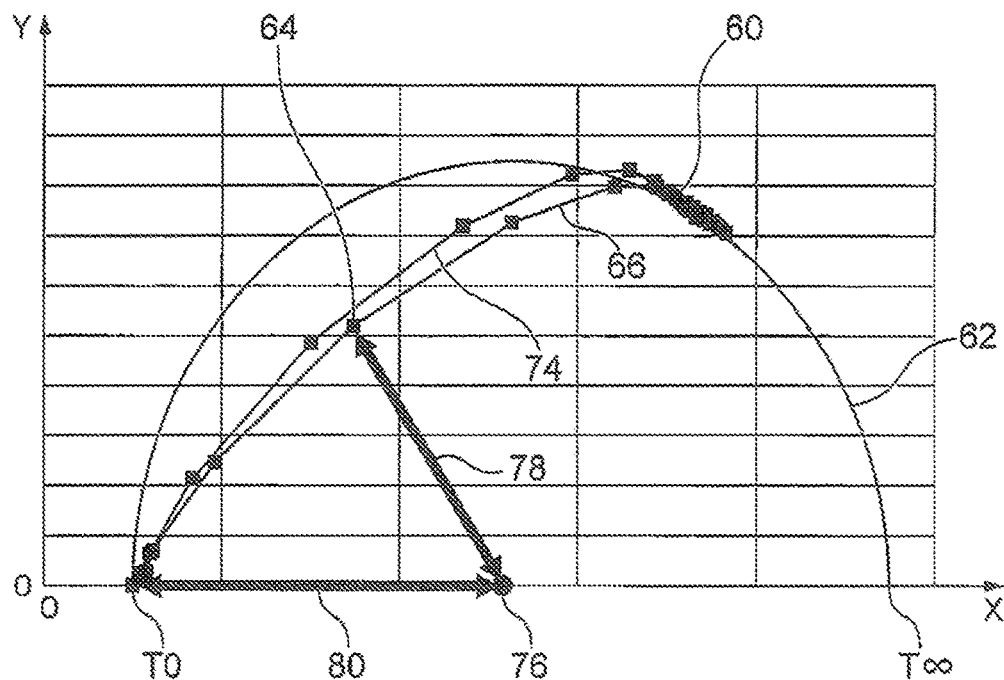
FIG. 15 is a diagram illustrating a first distance in FIG. 13.

The present embodiment performs correction as follows. As an index for indicating how incomplete the measuring points 64 at edges of the substrate W or the like are in comparison with the measuring points 60, a distance 78 (first distance) from a center 76 of the circle 62 to the measuring point 64 is used. The distance 78 is shown in FIG. 15. FIG. 15 illustrates the first distance in FIG. 13. A ratio between the distance 78 and a radius 80 (second distance) of the circle 62 of the impedance is assumed to be a degree of incompleteness. A correction coefficient is calculated from the degree of incompleteness.

Figure 17:
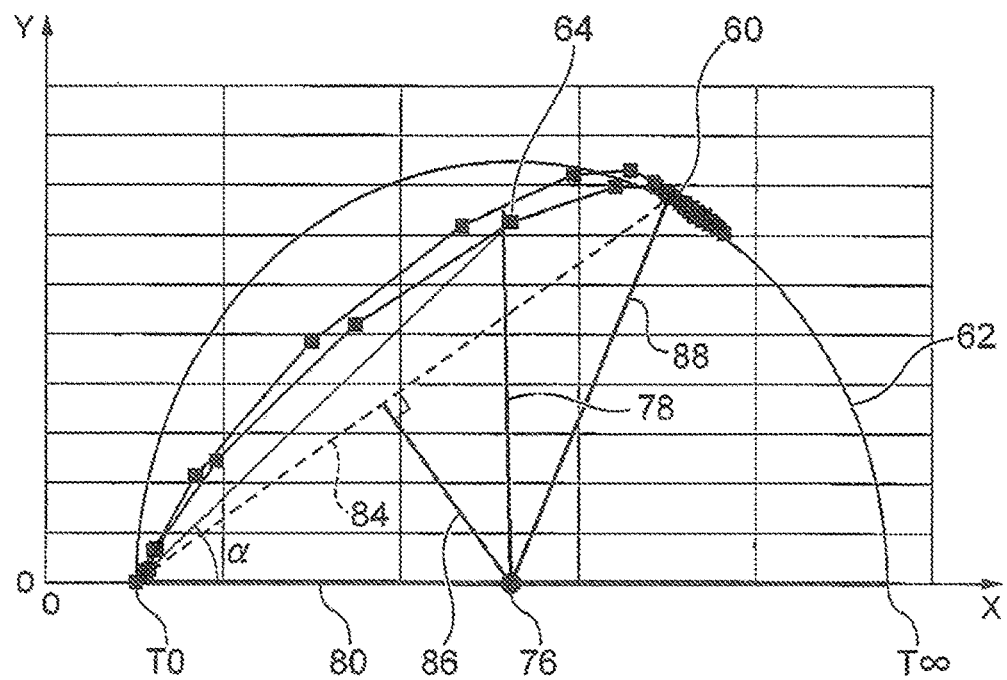
FIG. 17 is a diagram describing a method of calculating a correction coefficient.

A ratio with respect to a distance 88 shown in FIG. 17 from the center 76 of the circle 62 to the measuring point 60 where the whole magnetic flux 68 is considered to be effectively used, that is, considered to be a complete value may be assumed to be the degree of incompleteness. The distance 88 theoretically coincides with the radius 80 of the circle 62 of the impedance. However, there are some measurement errors as shown in FIG. 15.

Figure 16:
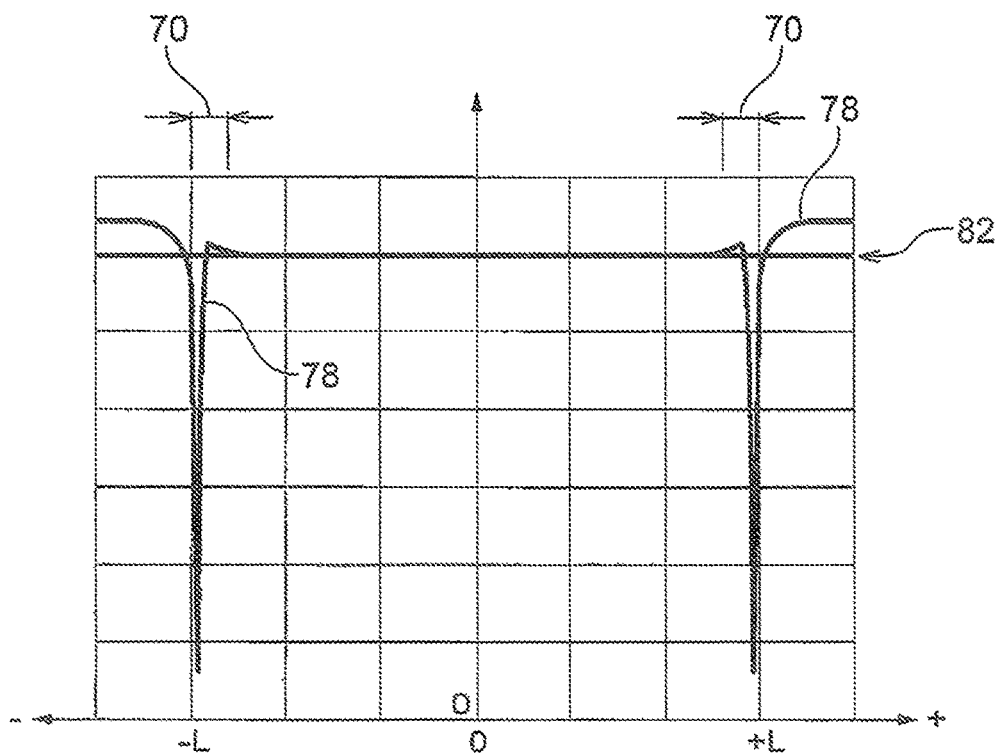
FIG. 16 illustrates an example of a distance between the center of a circle and a measuring point on an impedance coordinate plane.

FIG. 16 illustrates an example of measurement of the distance 78. The distance 78 is determined for the measuring points on the impedance plane coordinate system obtained using the eddy current sensor 210, and the distance 78 is illustrated in this diagram. The horizontal axis in FIG. 16 represents a distance (mm) from a center 90 of the substrate W (see FIG. 2) at the measuring point. The radius of the substrate W is assumed to be L. ±L represent ends of the substrate W. The vertical axis represents the distance 78. The vertical axis has no unit, that is, the vertical axis represents a dimensionless amount. A height 82 of the vertical axis represents the radius 80 of the circle 62 of the impedance. It is seen in this diagram that the distance 78 is different from the radius 80 at the edge 70 of the substrate W and that the measuring points 64 obtained at the edge 70 are not located on the circle 62.

Next, the method of calculating a correction amount from the degree of incompleteness will be described using FIG. 17. This method can be implemented in various ways. For example, the angle α shown in this diagram is determined from the measuring points 64 as described above and the film thickness t is determined from the reciprocal of the tangent of the angle α. The determined film thickness t is multiplied by the ratio of the radius 80 divided by the distance 78. As another method, a correction coefficient by which the determined film thickness t is to be multiplied or the like is measured in advance in accordance with the distance 78 using the substrate W. The correction coefficient may be saved in the storage unit in the format of a function, table or the like.

A further method will be described using FIG. 17. It is assumed that measured values at the edge 70 are outputted mainly as a mixture of the output corresponding to the film thickness in the vicinity of the center of the substrate W and the output when no conductive film of the substrate W exists. It is assumed that the output of the eddy current sensor 210 is located on a straight line 84 connecting the measuring point 60 in the vicinity of the center of the substrate W and a point T0. As shown in FIG. 17, the measuring point 64 is not actually located on the straight line 84, but the measuring point 64 is assumed to be located on the straight line 84. The correction amount is considered using a distance 86 between the straight line 84 and the center 76, that is, the distance 86 which is a minimum among the distances 78 as a reference.

A more specific calculation procedure is as follows. The following calculation procedure is executed, for example, by the film thickness calculation unit 238. The coordinates of the point T0, the coordinates of the center 76 which is a circular arc center and a radius of the circular arc are obtained in the process of calculating the angle α and converting it into a film thickness. An average of coordinates of the measuring point 60 on the impedance coordinate plane in the vicinity of the center of the substrate W not influenced by the edge 70 is calculated as an average output AveragePt. As a method of calculating the average output AveragePt, for example, a plurality of X coordinates and a plurality of Y coordinates of a plurality of measuring points 60 on the impedance coordinate plane are averaged respectively. When calculating the average output AveragePt, the user specifies how far from the center of the substrate W should be designated as a center range. For example, the measuring points 60 obtained in the circle area in a range of −100 mm to 100 mm from the center of the substrate W are considered as the targets.

Next, the minimum distance 86 is calculated from the coordinates of the point T0, the coordinates of the center 76 of the circular arc and the average output AveragePt which is the average of the coordinates of the measuring points 60. More specifically, an equation of the straight line 84 is obtained from the coordinates of the point T0 and the coordinates of the average output AveragePt. Next, the distance between the center 76 of the circular arc and the straight line 84 is calculated.

Next, the following correction coefficient Coeff (correction amount) is calculated using the distance 78 from the center 76 of the circle 62 at each measuring point 64 of the edge 70.

$$\text{Coeff}=1-A\times(R\_\text{idle}-R)/(R\_\text{idle}-R\_\text{idle\_min})$$

where A: adjustment coefficient
R_idle: radius 80
R: distance 78
R_idle_min: distance 86

Since the correction coefficient Coeff is R=R_idle at a point located on the impedance circular arc other than the edge 70, for example, the measuring points 60, the correction coefficient becomes 1. Therefore, the correction coefficient Coeff influences only the measuring points 64 other than in the vicinity of the edges 70, and so this is considered as a reasonable correction.

The film thickness t before correction is multiplied by the correction coefficient Coeff. That is, the correction is performed according to the following equation.

$$\text{Adjusted Thickness}(r)=\text{Thickness}(r)\times\text{Coeff} \quad (16)$$

where r: distance of measuring points 60 and 64 from center 76 of substrate W,
Adjusted Thickness (r): film thickness after correction as function of distance r
Thickness (r): film thickness t before correction as function of distance r
Coeff (r): correction coefficient Coeff In this equation, Adjusted Thickness (r) and Thickness (r) are assumed as functions of distance r. These are assumed as functions of distance r because they depend on the distance r as shown in FIG. 16.

Note that the range on the substrate W to which correction taking into account the distance 86 is applied may be limited to the edges 70 or the correction may be applied to the whole substrate W.

Figure 18:
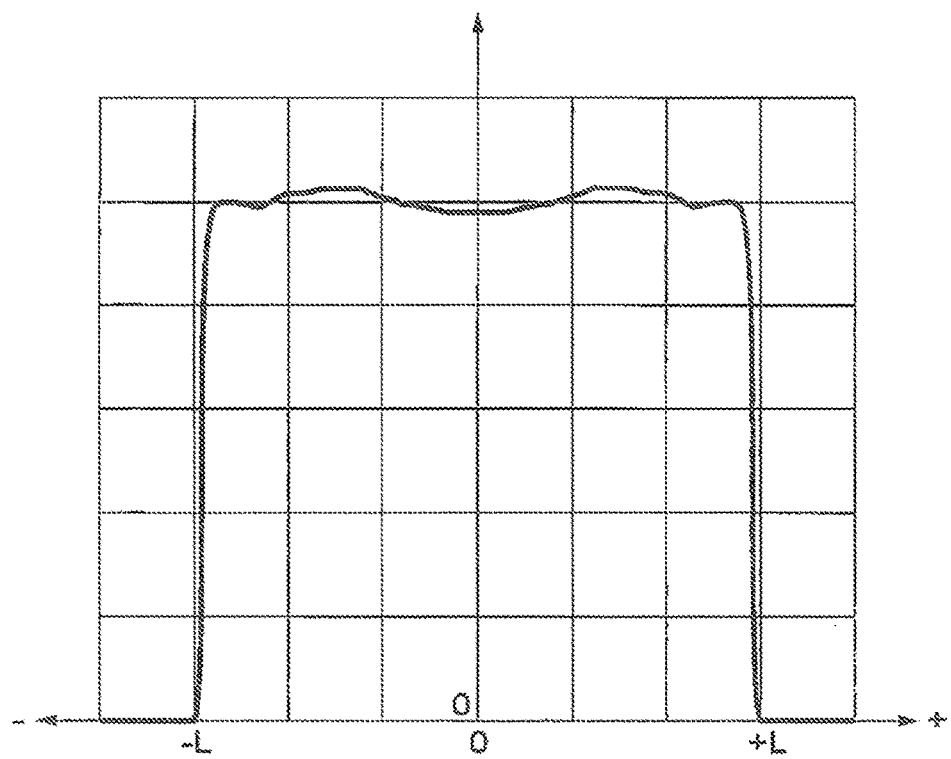
FIG. 18 is a graph illustrating a film thickness before correction.
Figure 19:
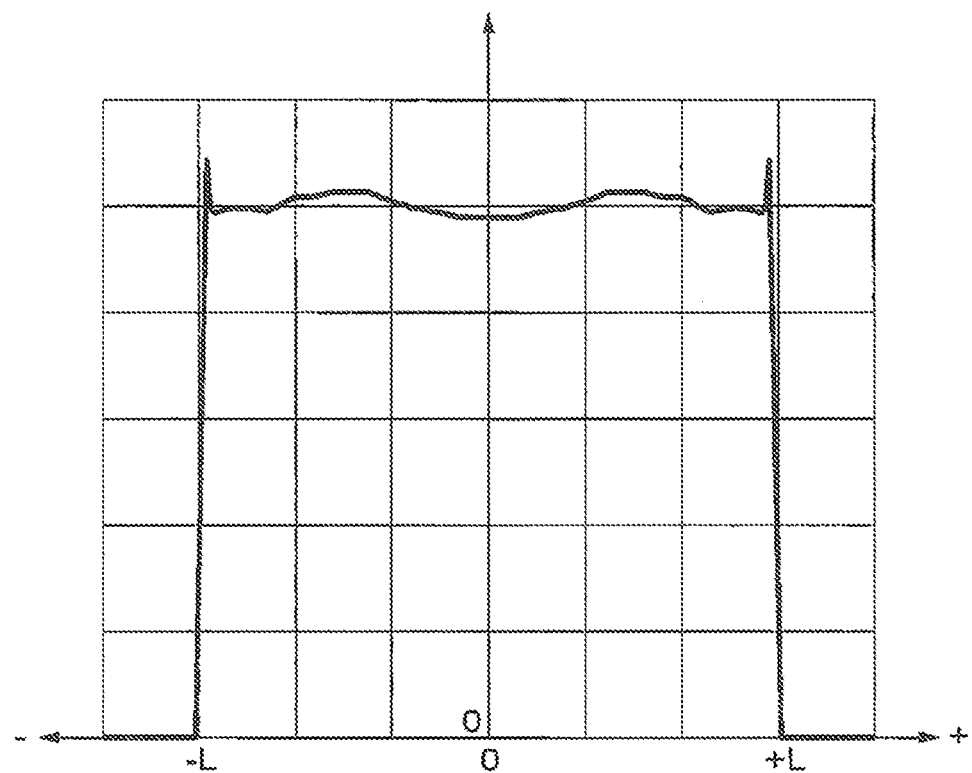
FIG. 19 is a graph illustrating a film thickness after correction.

FIGS. 18 and 19 illustrate results of correction by applying equation (16). FIG. 18 illustrates film thickness t before correction (Thickness (r) according to equation (16)). FIG. 19 illustrates a film thickness (Adjusted Thickness (r) according to equation (16)) after correcting the film thickness t shown in FIG. 18 according to equation (16). The horizontal axis in FIGS. 18 and 19 represents a distance (mm) of the measuring points 60 and 64 from the center 90 of the substrate W (see FIG. 2). The radius of the substrate W is assumed to be L. ±L represent ends of the substrate W. The vertical axis represents a film thickness t (nm). It is seen from FIG. 19 that the film thickness increases at the edges 70 of the substrate W by the correction and that the correction according to equation (16) is reasonable.

Note that after finishing polishing, the film thickness of the substrate W may be measured using a film thickness measuring machine disposed outside the first polishing unit 300A or the substrate processing apparatus 1000, information relating to the determined film thickness at the edge 70 may be inputted to the film thickness calculation unit 238 or the like and adjustment coefficients A may be optimized successively. Such successive optimization may be performed by a computer on a cloud/fog. Furthermore, such data may be applied to other sensors using the same type of wafer (other sensors in processing chambers for other semiconductor manufacturing apparatuses). As the film thickness measuring machine, an arbitrary publicly known measuring machine can be used as long as it can measure the film thickness t. Examples of such a film thickness measuring machine include an electromagnetic film thickness gauge, an eddy current film thickness gauge, an optical film thickness gauge, an electric resistance film thickness gauge and an eddy current phase film thickness gauge. The film thickness t can also be measured by observing a cross section using an electronic microscope.

The polishing method of polishing a substrate to be polished is performed as follows. With a substrate W to be polished being pressed against the polishing surface 104, the conductive film on the substrate W is polished. In order to measure the film thickness of the conductive film, an eddy current is formed in the conductive film using the eddy current sensor 210 and the formed eddy current is detected. The eddy current sensor 210 outputs the detected eddy current as an impedance component. The film thickness measuring apparatus 231 receives the impedance component as input and monitors the film thickness of the conductive film from the inputted impedance component. When a resistance component and a reactance component of the impedance component are associated with the respective axes of the coordinate system having two orthogonal coordinate axes, at least some points on the coordinate system corresponding to the impedance component form at least a part of the circle 62. The film thickness measuring apparatus 231 determines the first distance 78 between the measuring point 64 on the coordinate system and the center 76 of the circle 62, determines the film thickness t from the impedance component and corrects the determined film thickness t using the determined first distance 78.

Next, an example will be described where the first polishing unit 300A includes the temperature sensor 56 that can directly or indirectly measure the temperature of a substrate W under polishing and the end point detector 241 (temperature correction unit) that can correct the film thickness obtained using the measured temperature. The first polishing unit 300A includes the temperature sensor 56 for monitoring the temperature in the first polishing unit 300A. In FIG. 2, the temperature sensor 56 is disposed so as to monitor the temperature of the polishing pad 310A or the substrate W on the polishing pad 310A. The temperature sensor 56 may also be disposed inside the top ring 330A so as to measure the temperature of the substrate W. The temperature sensor 56 may also be in direct contact with the surface of the polishing pad 310A or the substrate W so as to monitor the temperature of the surface of the polishing pad 310A or the substrate W. The temperature sensor 56 may also be a non-contact sensor (e.g., infrared sensor). The temperature is used when measuring a film thickness.

The present embodiment performs temperature correction. The reason for performing temperature correction is as follows. When the monitoring apparatus calculates the film thickness from the impedance component, it uses correspondence information between the impedance component and the film thickness. When the temperature of a metal film increases due to polishing, electrical conductivity decreases. The correspondence information may be obtained in advance before polishing. The temperature of the metal film when obtaining the correspondence information is different from the temperature of the metal film when performing polishing after that and determining the film thickness using the correspondence information. Therefore, the temperature during measurement of the film thickness using the correspondence information may be higher or lower than the temperature when the correspondence information is obtained in advance. When the temperature is higher, the film thickness is measured to be less than the actual film thickness. More accurate film thickness values can be calculated by correcting the measured value of the film thickness using temperatures obtained using a temperature sensor that can directly or indirectly measure the temperature of the substrate.

The reason for correcting film thickness calculation using the temperature of the polishing pad 310A is as follows. Regarding the metal film on the substrate W, when the temperature of the substrate W rises, electrical conductivity thereof decreases. Therefore, at the time of the measurement of the eddy current sensor 210, the temperature of the substrate W generally rises from the temperature in calibration, and the film thickness may be erroneously measured as if it is smaller than the actual film thickness.

The film thickness can be calculated correctly by correcting erroneous measurement using the temperature of the polishing pad 310A. The end point detector 241 performs correction according to the following equation.

$$\text{Thickness\_adj} = \text{Thickness} \times (1 + k \times [(T - T\text{cal}) \times \alpha + T])/(1 + k \times T\text{cal}) \quad (A1)$$

where, Thickness_adj: film thickness t after correction
Thickness: film thickness t before correction
T: table temperature under polishing
Tcal: temperature of polishing pad 310A when eddy current sensor 210 is calibrated
k: temperature coefficient of resistivity (metal-specific value)
α: coefficient dependent on first polishing unit 300A For example, in the case of Cu in a bulk state (that is, Cu having somewhat large volume), k=0.0044 and when the temperature during calibration is 20° C., the film thickness of the metal film measured in an environment of 50° C. becomes 1/1.121 times. That is, the film thickness is measured approximately 4% less due to a temperature rise of 10° C.

The basis for the correction of film thickness calculation according to the above-described equation (A1) is as follows.

When the temperature of the metal is T, if the film thickness is assumed to be Thickness1, Thickness1 is expressed by the following equation.

$$\text{Thickness1} = \rho(T)/Rs$$

where ρ(T) is conductivity of the metal when the temperature of the metal is T, $$\rho(T) = \rho o(1 + kT) \quad (A2)$$

ρo is conductivity of metal at temperature when calibration is performed
Rs is sheet resistance When no temperature correction is performed, since the first polishing unit 300A has an approximate equation at the temperature during calibration, film thickness calculation is assumed to be performed at ρ(Tcal). Here, Tcal is a metal temperature during calibration.

However, when the temperature of the substrate W becomes T during polishing, the film thickness should be calculated using ρ(T). Therefore, the film thickness can be corrected according to the following equation.

$$\text{Adjusted Thickness} = \text{Calculated Thickness} \times \rho(T) \div \rho(T\text{cal})$$

where, Adjusted Thickness: film thickness corrected using ρ(T)
Calculated Thickness: film thickness before correction obtained according to approximate equation If this is expressed using T according to equation (A2), $$\text{Adjusted Thickness1} = \text{Calculated Thickness} = (1 + k \times T)/(1 + k \times T\text{cal})$$

Furthermore, the temperature of the polishing pad 310A is basically lower than the temperature of the substrate W. To correct the temperature of the polishing pad 310A into the temperature of the substrate W, the system-dependent coefficient α is added so that the correction coefficient at Tcal becomes 1. The result is the above-described equation (A1).

$$\text{Thickness\_adj} = \text{Thickness} \times (1 + k \times [(T - T\text{cal}) \times \alpha + T])/(1 + k \times T\text{cal}) \quad (A1)$$

Next, an example of a configuration for handling information in the above-described first polishing unit 300A will be described using FIG. 20 to FIG. 22. However, in FIG. 20 to FIG. 22, the first polishing unit 300A is described simply and a more specific configuration (top ring 330A, polishing pad 310A or the like) is omitted.

Figure 20:
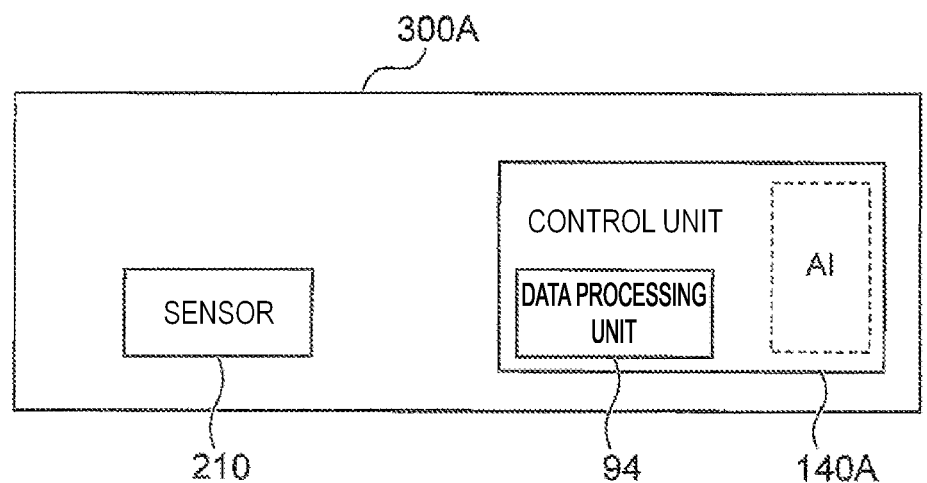
FIG. 20 is a block diagram illustrating control of a first polishing unit using AI.

FIG. 20 is a diagram illustrating an example of the first polishing unit 300A provided with a control unit 140A including a data processing unit 94. The data processing unit 94 may be mounted with an AI (Artificial Intelligence) function. The data processing unit 94 may be some hardware and may be a program stored, for example, in a storage medium. In FIG. 20, the data processing unit 94 is described as an element independent of other elements of the control unit 140A, but the data processing unit 94 may be stored, for example, in a storage device (not shown) provided for the control unit 140A and controlled by a processor (not shown) of the control unit 140A. The data processing unit 94 is configured to perform image processing and processing requiring large-scale computation such as generation and acquisition of a polishing profile, update of control parameters and feedback using real main signals as learning data. The configuration in FIG. 20 has an advantage that the first polishing unit 300A can be singly operated (as a standalone unit).

Figure 21:
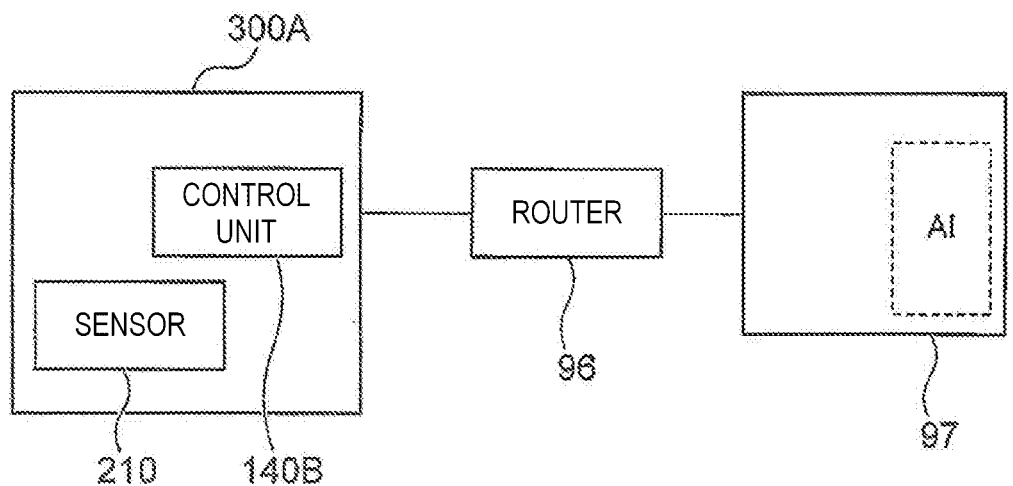
FIG. 21 is a block diagram illustrating control of the first polishing unit using AI.

FIG. 21 is an example of the first polishing unit 300A connected to a cloud (or fog) 97 via a router 96. The router 96 is an apparatus for connecting a control unit 140B to the cloud 97. The router 96 can also be called an "apparatus with a gateway function." The cloud 97 refers to a computer resource provided through a computer network such as the Internet. Note that when the connection between the router 96 and the cloud 97 is a local area network, the cloud may also be called "fog 97." For example, when connecting a plurality of factories scattered on the earth, the cloud 97 is used, and when constructing a network within a certain factory, the fog 97 may be used. The fog 97 may be further connected to an external fog or cloud. In FIG. 21, the control unit 140 and the router 96 are connected by cable, and the router 96 and cloud (or fog) 97 are connected by cable. However, each connection may also be a wireless connection. A plurality of first polishing units 300A are connected to the cloud 97 (not shown). Each of the plurality of first polishing units 300A is connected to the cloud 97 via the router 96. The data (film thickness data from the eddy current sensor 210 or any other information) obtained by each first polishing unit 300A is accumulated at the cloud 97. The cloud 97 in FIG. 21 may also have an AI function, and data is processed in the cloud 97. However, data may also be partially processed at the control unit 140B. The configuration in FIG. 21 has an advantage that the first polishing unit 300A can be controlled based on a large amount of accumulated data.

Figure 22:
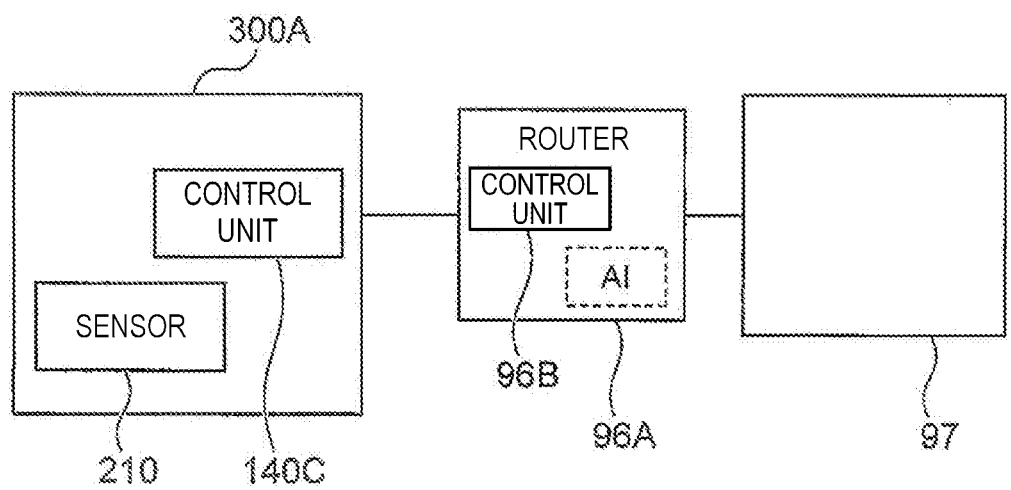
FIG. 22 is a block diagram illustrating control of the first polishing unit using AI.

FIG. 22 is a diagram illustrating an example of the first polishing unit 300A connected to the cloud (or fog) 97 via a router 96A having an edge computing function. The cloud 97 in FIG. 22 is also connected to a plurality of first polishing units 300A (not shown). Each of the plurality of first polishing units 300A in FIG. 22 is connected to the cloud 97 via the router 96A. However, some of the routers may not be provided with the edge computing function (some of the routers may be the routers 96 in FIG. 21). The router 96A is provided with a control unit 96B. However, FIG. 22 illustrates only one router 96A provided in the control unit 96B as a representative. Furthermore, an AI function may also be mounted on the router 96A. The AI functions of the control unit 96B and the router 96A can process data obtained from the control unit 140C of the first polishing unit 300A near the first polishing unit 300A. Note that the "nearness" referred to here is not a term that means a physical distance, but it is a term that refers to a distance on a network. However, if a distance on a network is small, the physical distance is often small too. Therefore, if the computation speed at the router 96A and the computation speed at the cloud 97 are on the same level, the processing at the router 96A is faster than the processing at the cloud 97. Even if there is a difference in the computation speed between the two, the speed at which information transmitted from the control unit 140C reaches the router 96A is faster than the speed at which information transmitted from the control unit 140C reaches the cloud 97.

The router 96A in FIG. 22 or more specifically, the control unit 96B of the router 96A processes only data requiring fast processing among data to be processed. The control unit 96B of the router 96A transmits data not requiring fast processing to the cloud 97. The configuration shown in FIG. 22 has an advantage that fast processing near the first polishing unit 300A is compatible with control based on accumulated data.

Although examples of the embodiments of the present invention have been described so far, the above-described embodiments of the invention are intended to facilitate an understanding of the present invention, but are not intended to limit the present invention. The present invention can be modified or improved without departing from the spirit and scope of the present invention and it goes without saying that the present invention includes equivalents thereof. The components described in the scope of the patent claims and the specification can be arbitrarily combined or omitted within the scope in which at least some of the aforementioned problems can be solved or within the scope in which at least some of the effects are exerted.

This application claims priority under the Paris Convention to Japanese Patent Application No. 2018-133606 filed on Jul. 13, 2018. The entire disclosure of Japanese Patent Laid-Open No. 2005-121616 including specification, claims, drawings and summary is incorporated herein by reference in its entirety.

REFERENCE SIGNS LIST 56 temperature sensor
60 measuring point
62 circle
64 measuring point
70 edge
76 center
78 distance
80 radius
102 polishing target
104 polishing surface
140 control unit
150 polishing unit
231 film thickness measuring apparatus
234 angle calculation unit
238 film thickness calculation unit
241 end point detector
1000 substrate processing apparatus
300A first polishing unit
310A polishing pad
320A polishing table
330A top ring

What is claimed is:
1. A polishing apparatus comprising:
a rotatable polishing table;
a top ring;
an eddy current sensor disposed in the polishing table;
a monitoring circuit;
a processor; and a non-transitory storage medium having executable instructions stored thereon;
wherein the executable instructions, when executed by the processor, cause the apparatus to perform operations including:
holding, by the rotatable polishing table, a polishing pad having a polishing surface;
pressing, by the top ring, a substrate to be polished against the polishing surface and polishing a conductive film on the substrate;
monitoring, by the monitoring circuit, a film thickness of the conductive film based on an output of the eddy current sensor, wherein
the output of the eddy current sensor includes an impedance component,
when a resistance component and a reactance component of the impedance component are associated with respective axes of a coordinate system having two orthogonal coordinate axes, at least some points on the coordinate system corresponding to the impedance component form at least a part of a circle, and
determining, by the monitoring circuit, a first distance between the point on the coordinate system and a center of the circle, and determining a film thickness from the impedance component and correcting the determined film thickness using the determined first distance.

2. The polishing apparatus according to claim 1, wherein the executable instructions, when executed by the processor, further cause the apparatus to perform operations including:
performing, by the monitoring circuit, the correction using a predetermined correction coefficient in accordance with the first distance.

3. The polishing apparatus according to claim 1, wherein the executable instructions, when executed by the processor, further cause the apparatus to perform operations including:
performing, by the monitoring circuit, the correction on the film thickness obtained in a peripheral part of the substrate.

4. The polishing apparatus according to claim 1, wherein the executable instructions, when executed by the processor, further cause the apparatus to perform operations including:
determining, by the monitoring circuit, a second distance corresponding to a radius of the circle and perform the correction using the first distance and the second distance.

5. The polishing apparatus according to claim 1, further comprising a temperature sensor and a temperature correction unit:
wherein the executable instructions, when executed by the processor, further cause the apparatus to perform operations including:
directly or indirectly measuring, by the temperature sensor a temperature of the substrate under polishing; and
further correcting, by the temperature correction unit, the corrected film thickness using the measured temperature.

* * * * *